United States Patent [19]
Grassmann

[11] Patent Number: 6,054,949
[45] Date of Patent: Apr. 25, 2000

[54] METHOD AND APPARATUS FOR DETERMINING INCIDENT RECEIVED POWER OR ENERGY OR OTHER TECHNICAL MEASUREMENT VALUES OF AT LEAST ONE SIGNAL IN AT LEAST ONE PREDETERMINED DIRECTION OF OBSERVATION, AND RECEIVING EQUIPMENT

[76] Inventor: Edgar Grassmann, Edemisser Strasse 12, D-31234, Edemissen, Germany

[21] Appl. No.: 08/950,684

[22] Filed: Oct. 15, 1997

[30] Foreign Application Priority Data

Oct. 16, 1996 [DE] Germany .................. 196 42 630

[51] Int. Cl.⁷ .................................... G01S 3/16
[52] U.S. Cl. .......................... 342/383; 342/380
[58] Field of Search ................... 342/378, 383, 342/382, 380, 52

[56] References Cited

U.S. PATENT DOCUMENTS 5,128,683  7/1992  Freedman et al. .................. 342/158

*Primary Examiner*—Thomas H. Tarcza
*Assistant Examiner*—Dao L. Phan
*Attorney, Agent, or Firm*—Shlesinger, Arkwright & Garvey LLP

[57] ABSTRACT

The invention relates to a method and to apparatus for determining incident received power or energy or other technical measurement values of at least one signal in at least in one predeterminable direction of observation, further to receiving equipment. The method of the invention allows unambiguously determining the received power or energy of a signal incident in a predeterminable direction of observation even when additional signals are simultaneously incident from other directions. The method of the invention can be implemented using a sensor or antenna array of unfilled aperture.

59 Claims, 17 Drawing Sheets

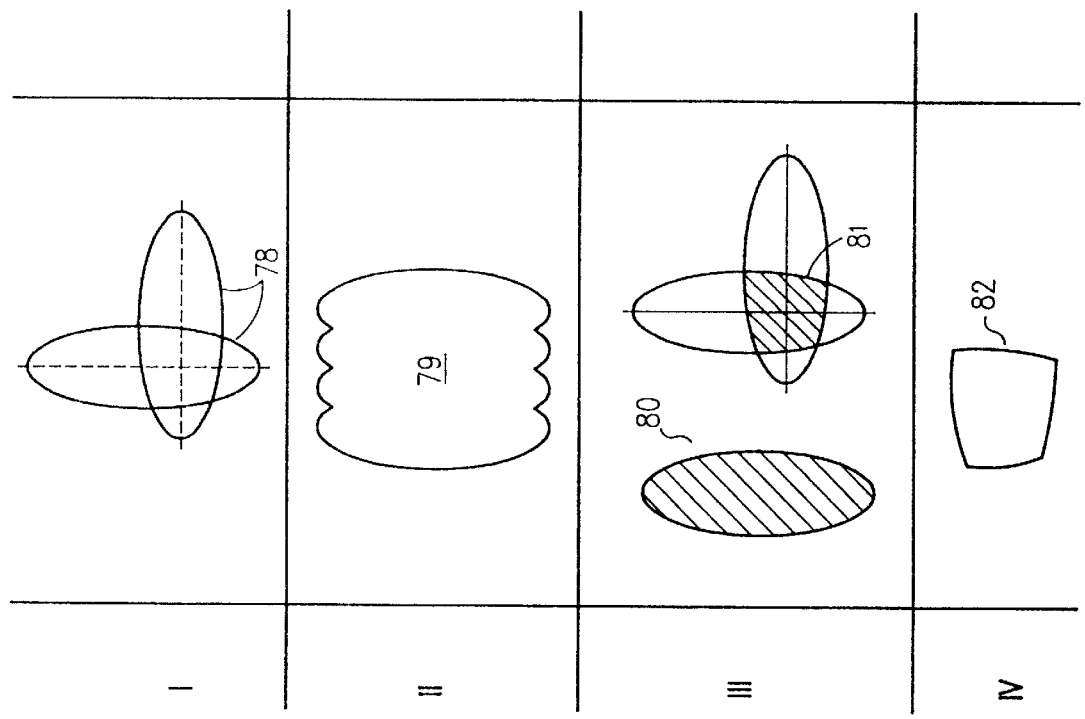

METHOD AND APPARATUS FOR DETERMINING INCIDENT RECEIVED POWER OR ENERGY OR OTHER TECHNICAL MEASUREMENT VALUES OF AT LEAST ONE SIGNAL IN AT LEAST ONE PREDETERMINED DIRECTION OF OBSERVATION, AND RECEIVING EQUIPMENT

FIELD OF THE INVENTION

The invention concerns a method and apparatus for determining incident, received power or energy or other technical measurement values of at least one signal in at least one predeterminable direction of observation and further to receiving equipment.

BACKGROUND OF THE INVENTION

Methods for determining incident received power or energy making use of antenna systems are known, by means of which at least two or however also more asymmetric radiation patterns predeterminable in their direction and position and determined by the antenna geometry can be generated. The radiation patterns maybe conical or fan-shaped; they are also called radiation fan-beams. In the known method, the radiation patterns may mutually penetrate each other in predeterminable manner in intersection zones and numbers and with arbitrary spatial distribution.

The expression "intersection zone" is defined as the set of those radiation patterns or fan beams of which the mutual penetration is determined mainly but not necessarily solely in a given main direction of radiation. In this manner and in the known method, it is possible to synthetically generate narrower radiation patterns, namely using so-called unfilled apertures (see "Interferometry and Synthesis in Radioastronomy", A. Richard Thompson, James M. Moran, George W. Swenson, pp 118, Krieger Publishing Company, 1991; "The Synthesis of large Radio Telescopes", M. Ryle, A. Hewish, in Instrumentation and Techniques for Radio Astronomy, p 97) are also mainly characterized in that they comprise several single sensors, for instance antennas, the conical or fan-beam radiation patterns being formed by known beam-shaping means and methods from the output signals of said single sensors. Accordingly when using unfilled apertures, it is possible to generate simultaneously from the single sensors' output signals an arbitrarily, predeterminable number of radiation patterns.

An example of a beam-shaping means generating simultaneously a given number of directionally determined radiation patterns (fan beams) from the output signals of a row of single sensors is the Butler matrix (see for instance "Antenna Engineering Handbook", Richard C. Johnson, chapter 20–56, McGraw-Hill Inc. 1991) which uses analog means to reproduce the function of a Fourier transformation (FFT). The radiation patterns, for instance fan beams, however also may be generated using different radiation shaping means (see for instance "Computational Methods of Signal Recovery and Recognition", Richard J. Mammone, pp 272, John Wiley & Sons Inc., 1992), for instance by using a phase network.

The unfilled apertures also comprise those making it possible that different fan-beam or conical radiation patterns mutually penetrate in localized pattern zones. This is the case for instance for rows of antennas subtending an angle with each other. One the many possible ways is the so-called Mills Cross wherein two rows of dipoles are mutually orthogonal, for instance in cross or L shape. Such arrays of unfilled-aperture antennas and sensors allow generating asymmetric, fan-beam or conical radiation patterns which are considerably narrower in one plane than in another.

Radiation patterns which are rotationally symmetric or which are approximately of equal widths in all planes can be generated directly only using filled apertures, however entailing complexity and costs which are a multiple of those of unfilled apertures. An example relating to a filled aperture is the surface of a parabolic mirror. An example relating to an unfilled aperture is a row of dipoles.

In the known methods, the fan beams forming an intersection zone are processed by analog or digital apparatus to form a new radiation pattern by correlation. Because a signal arriving from the intersection point or intersection zone simultaneously is a common element of the intersecting radiation patterns, a correlation result is present at the intersection point in the form of an antenna lobe which on the whole is narrower and more sharply defined than the fan beams or radiation patterns forming the intersection zone.

If for instance in the known methods a Mills Cross is formed that consists of two rows of dipoles, then, using the aforementioned Butler matrix, it is possible to generate a predetermined number of mutually orthogonal fan beams which can be mutually correlated in all desired combinations in their intersection zones.

The known method incurs a drawback in that other sources of interference or signals not arising in the intersection zone but incident on a fan beam will spuriously affect the measurement taken in the direction of the intersection zone, independently of the synthetic formation of the pattern. In particular as regards simultaneous spatial distribution of a full set of the intersection zones formed by the fan beams, unambiguousness will be entirely lost in the presence of interference.

In the known methods, a radiation pattern is formed from correlation and this pattern ideally will incorporate only signals coming from the direction of the common intersection zone. However the correlation differs from those procedures which vectorially combine the signal voltages of the single sensors, for instance in an analog network, in phase and amplitude. A large noise source present in the fan beam pattern but not incident along the main radiation direction will produce, without being regularly reduced by the correlation, a corresponding received power in the analyzer of the pertinent fan beam. As a result, a real signal incident in the main direction of radiation must be processed in the affected fan-beam channel at a higher receiver noise level than in the absence of said noise source. The actual signal in the presence of noise is hidden deeper in noise than without said noise source, the correlations will be different in each case. The difference in correlation results does not change the shape of the correlation function or that of the synthetic radiation patterns, but only the value of the correlation.

Illustratively if it is assumed that the noise source is a pulsed source and that the real signal also is formed in the main direction of radiation by a pulsed noise signal, then correlation no longer can unambiguously distinguish between pulse timing and its associated source in the known method. If the interference source of the one main direction of radiation simultaneously is the real signal in another direction of a common fan beam, then the signals no longer can be unambiguously distinguished by correlation in the known method. Consequently the received power or energy in turn no longer can be unambiguously ascertained along a main direction of radiation. In apparatus comprising a substantial number of mutually intersecting fan beams, the unambiguousness of the measurement will be completely lost.

Accordingly another drawback of the known method is that only a single signal source may be present within a given frequency bandwidth or that the signal level at least must be large compared to other signals (see "Radio Astronomy", John D. Kraus, chapter 6–25, Cygnus Quasar Books, 1986).

This feature entails another drawback of the known method using sensors having unfilled apertures, namely that it is impossible to simultaneously and unambiguously determine the received power of signals only differing by the direction of incidence within a given frequency bandwidth.

OBJECTS AND SUMMARY OF THE INVENTION

Therefore it is the object of the present invention to create a method and apparatus allowing to determine more accurately the incident received power or energy of a signal in a predetermined direction of observation, even where other signals from other directions are present.

This objective is solved by the method and apparatus of the disclosure.

The invention is based on the insight that, when several signals from directions are simultaneously incident on a sensor system, a real signal from a given direction within a fan beam at the same time may be an interference signal within the same fan beam in another direction and that consequently the measurement of received power in one direction of observation depends on the power of signals which are incident in other directions.

The invention is furthermore based on the insight that accordingly the power incident in a given direction of observation cannot be ascertained directly.

The basic concept of the disclosure of the invention is that, for instance when considering an intersection zone subtended by two fan beams, more than the received power associated with the intersection zone alone must be taken into consideration, that instead the total power must be considered which is held in the fan beams forming the intersection zone.

In a further concept of the invention, a so-called main signal space is formed from a predetermined number of fan beams.

The expression "signal space" (see "Advanced Signal Processing and Digital Noise Reduction", Saeed V. Vaseghi, pp 4, pp 20, Wiley & Sons Inc. 1996; "Computational Methods of Signal Recovery and Recognition", Richard J. Mammone, p 13, John Wiley & Sons Inc., 1992) denotes a set of signals.

In the invention, first a number of formed fan beams is selected and, based on these fan beams, a main signal space is formed representing the shape of these fan beams and the received power or energy associated with these fan beams. If for instance a sensor system of two sensor rows is involved, these sensor rows generating two fan beams, then the boundary curve of the main signal space can be formed by vectorially summing the boundary curves of the two fan beams, the main signal space then simultaneously representing that received power or energy which is associated with the two fan beams.

Based on this main signal space, the invention determines a measure of the portion of each of the fan beams participating in the formation of an intersection zone of the total received power or energy associated with the main signal space.

If this measure is known for each fan beam participating in the formation of a given intersection zone, then a measure of the portion of the received power or energy associated to this intersection zone, said intersection zone being formed by the fan beams, can be determined.

The measures so determined form interim results of which the combination determines which portion is contributed by the intersection zone under consideration, and hence by a predetermined direction of observation, to the total received power or energy of the main signal space. In this manner the total power or energy can be determined in relation to every intersection zone and hence in relation to a predetermined direction of observation, essentially free of confusion, that is essentially free of ambiguities that might be caused by signals incident from other directions.

Consequently when the measurements are being carried out in a given direction of observation, signals incident from other directions cannot, on account of the method of the invention, affect the measurement results and hence a measurement in a given direction of observation always takes place free of confusion, and thus the method of the invention makes it possible to determine the particular incident received power or energy simultaneously in several, arbitrarily predetermined directions of observation.

As a rule the selection of a desired direction of observation (direction of measurement) is determined by the selection of the intersection zones.

Thereby the method of the invention also makes possible the simultaneous analysis of the received power or energy of same-channel signals merely differing in their directions of incidence. An interfering signal in one direction of observation thus may be simultaneously a real signal in another direction of observation, without the measurement results in different directions of observation being negatively affected.

A further advantage of the invention is unambiguous determination of the received power or energy also when using a sensor or antenna array with unfilled aperture. Accordingly costly sensor or antenna arrays with filled apertures are basically not required and more economical apparatus is applicable for implementing the invention.

Another advantage of the method of the invention is that it offers very high processing rates and thereby high efficiency because the signals to be processed need not be quantized in maximum bit-value resolution to achieve the desired resolution of the received level of power or energy. The method of the invention being based on forming relative measurements, for instance probability measurements, only reduced quantization down to 1-bit quantization (two-level quantization) is required. Using these relative measurements, an absolute measurement taken once per measurement procedure, for instance for the main signal space, of the total received power or energy, allows determining the absolute values of received power or energy associated to the individual directions of observation (measurement).

The different method steps of the method of the invention may be carried out in parallel, whereby the processing rate is raised.

Arbitrary beam shaping devices generally known to the expert are appropriate to shape fan beams from the output signals of individual sensors or sensor areas, in particular however from the output signals of groups of sensors.

The determination of received power or energy also includes in the sense of the present invention the determination of other measurement values of a received signal that are related to the received power or energy. Illustratively received voltages or complex modulation signals can be analyzed in time.

Basically it is enough that the fan beams form one intersection zone. However, in a further development of the invention, the fan beams form at least two, preferably more than two intersection zones in such manner that different directions of observation may be selected by selecting different intersection zones. In this implementation of the invention, a desired direction of observation is selected by the selection of corresponding intersection zones.

Basically it is enough, when determining the received power or energy incident in a desired direction of observation, that two fan beams subtend one intersection zone. However in an especially advantageous implementation of the invention, at least three fan beams shall form a spatial intersection zone forming one region of observation in such manner that the received power or energy from the region of observation shall be determinable. Accordingly, in this implementing mode, it is possible to determine not only the received power or energy from a given direction of observation, but also the received power or energy from a spatially bounded and hence localized region of observation. If for instance an object is present in a region of observation selected by a corresponding selection of intersection zones or fan beams, and said object generates a received power or energy, for instance the signal from said objective being active or passive, then the presence of said object can be determined within the selected region of observation and as a result the object can be localized.

In another development of the invention, the incident received power or energy is determined simultaneously in at least two directions of observation and/or for at least two regions of observation. In this manner measurement can be carried out simultaneously in several directions of observation because there will be no interference as regards one direction of observation or region of observation in the determination of the received power or energy from other received powers or energies from other directions of observation or regions of observation and as a result the determination of the received power or energy shall be confusion-free for each direction of observation or region of observation.

Basically it is enough to take a relative measurement of the incident received power or energy for a desired direction of observation or a desired region of observation. If for instance the measurement is carried out simultaneously in two directions of observation, then it is fundamentally sufficient to take a relative measurement of the incident received power or energy for the directions of observation in order to be able to conclude what the ratio of the received powers or energies of one direction of observation is to the other. In an especially advantageous further development of the invention, however, the total received power or energy associated with the main signal space, or a corresponding factor of this total received power or energy, will be determined. If the absolute value of the total power or energy associated to the main signal space has been determined in that manner, which is a step required basically only once per measurement procedure, then, by means of this absolute value and the relative portion of a given intersection zone and hence of a given direction of observation of the total received power or energy, the absolute value of that received power or energy can be determined which is associated to the particular intersection zone and hence to the particular direction of observation. The received power or energy associated to a fan beam also may be determined instead of the absolute received power or energy associated to the main signal space because the invention makes it possible to determine a relative measure for each fan beam of the total received power or energy, and thereby the knowledge of the absolute value of the received power or energy of one fan beam allows absolute scaling all other values of the other fan beams and intersection zones. If the power or energy absorbed across an intersection zone is known beforehand, for instance by a preliminary measurement transmission signal (calibration signal) of known or predetermined power or energy, then this intersection zone may be used for scaling.

Appropriately the main signal space is generated and/or represented by an additional sensor as a function of the shape of the fan beams and of the received power or energy associated to the fan beams, or the main signal space is formed by vectorially summing the fan beams.

In a further development of the invention, relating to three fan beams forming a three-dimensional region of observation, the position of an object in space is ascertained by determining the received power or energy from the region of observation. Illustratively by consecutively observing a region of observation, it is possible to determine when an object is present inside this region of observation. Illustratively it is further possible to ascertain by means of simultaneous observation of several regions of observation at what time the object is present in what region of observation. In this manner it is possible to monitor object motion in three-dimensional space and/or to localize one or more objects in three-dimensional space provided that the object produce an arbitrary signal of which the received power or energy can be determined. The signal for instance may be emitted by the object in the form of a radio signal. However and illustratively, the signal also may be one reflected by the object, for instance being a radar signal.

In another further development of the invention, several directions of observation or observation spaces of at least one object can be swept at least partly by means of consecutively different selections of the directions of observation or observation spaces or by simultaneously selecting several directions of observation or regions of observation. In this manner the energy distribution at the surface of an object may be determined two-dimensionally or also three-dimensionally.

In a further development of the above mode of implementation, scanning the object or the energy or power distribution of the object(s) allows forming an image of the object(s). In this manner the method of the invention may be used as an imaging procedure, whereby the desired two-dimensional, namely surface resolution, or the three-dimensional, namely spatial resolution, can be selected within wide limits. In this case too the received power or energy of an arbitrary signal allows forming an image of the object. Illustratively the sensors may be designed to detect heat radiation, whereby the received power or energy from the object's heat radiation can be determined. By simultaneously or consecutively selecting corresponding directions of observation or regions of observation, it is possible to image the object in this manner.

The position of at least one stationary and/or the position of at least one moving object will be determined in another implementing mode. Accordingly the localization of arbitrarily stationary or moving objects or groups of objects is made possible, for instance of underwater shoals of fish, land vehicles, water craft or aircraft.

The position of a moving object is monitored in another mode of implementation, the position of a moving object is monitored by consecutive and different selection of the direction of observation or of the region of observation.

The method of the invention allows receiving arbitrary signals producing in any manner a received power or energy. Appropriately the signal of which the received power or energy is being determined can be a radiometric signal, or a signal emitted from the object in passive and/or active form or a reflected one. The received power also may be for instance in the form of radioactivity radiation.

In another implementation, the received power or energy of a signal is determined as a measure of the absorption of this signal by an object present in the direction of observation or in the region of observation. If for instance the received power of incident radiometric radiation is determined, then, if an object is present in the direction of observation or in the region of observation, the radiometric radiation is held in this object. The absorption of the radiometric radiation changes the received power or energy incident in the direction of observation or from the region of observation. In this manner it is possible not only to ascertain that an object is present in the direction of observation or in a region of observation, but also to what extent and in which distribution this object absorbs the radio-metric radiation.

Basically the sensor systems used in the method of the invention may evince a filled aperture, for instance the filled aperture may be formed by the surface of a parabolic mirror. To form the fan beams, row-like areas of the filled aperture may then be used. Illustratively to generate the fan beams, two mutually orthogonal row-like areas of the filled aperture may be used which per se each evince the properties of an unfilled aperture. Using appropriate beam shaping means, a first group of fan beams may be derived from the first row-shaped area and a second group of fan beams from the second row-shaped area. However, in an advantageous further development of the invention, the sensors shall not evince a filled aperture, and shall be formed in particular by at least two rows of sensors, each composed of sensors in a row. Because sensor arrays having unfilled apertures are more economical than arrays having filled apertures, the equipment cost of implementing the method of the invention is thereby lowered.

Basically two rows of sensors are sufficient. However more than two rows of sensors may be used, for instance using at least three spatially mutually oriented fan beams in order to form in the aforementioned manner a spatially bounded region of observation. The mutual positions of the sensor rows is arbitrarily selectable in three- or two-dimensional manner depending on the particular requirements.

Appropriately an intersection zone shall be formed by at least one fan beam associated to the first sensor row and at least one fan beam associated to the second sensor row. When more than two sensor rows are used, an intersection zone will be formed by several fan beams, at least one of the fan beams originating from each sensor row.

In another unusually appropriate further development of the invention, the signal of which the incident received power or energy is being determined is formed by a radiowaves reflected from and/or diffracted by radiowaves by a meteorite trail of a meteorite moving in the earth atmosphere. Meteoric propagation of radio waves is well known to the expert. It rests on the radio waves being reflected from and/or diffracted by meteorite trails generated by meteorites moving in the earth atmosphere. Because of said reflection or diffraction at the meteorite trail, a signal transmitted by transmitter can be received by a receiver. Because the meteorite trail is ephemeral, the useful transmission time across meteorite trail—depending on the kind of meteorite, the speed of entry and the frequency—lasts from a few milliseconds up to minutes.

An example of a system based on meteoric propagation is the C3 meteorite burst network for connections between the continental USA, Alaska and Canada. An important feature of transmission systems, that of meteoric propagation, is its robustness against interference and low interceptibility.

To a first approximation and on geometric grounds, the connection via a meteorite trail is only possible between those stations located at the foci of an ellipsoid itself tangential to the meteorite trail. The region wherein the signal can be received is called the "footprint". For a transmission path of 500 km, the region diameter is about 20 km for a 90% probability of receiving. The probability of receiving drops rapidly outside the footprint. Such transmission system operate in so-called "bursts". Such a transmission is based on the principle that one station in the network, for instance the master station, sends an "idle" signal. If another station is able to receive the idle signal by means of a meteorite trail, it will open its data buffer and will transmit. At the same time and in reply the master station opens its data buffer and transmits it in duplex. If the meteorite trail no longer suffices for connection, the data transmitters will shut down and the master station will only transmit the idle signal.

In this respect the advantage of the method of the invention on one hand is that it is possible to take measurements in a plurality of observation facilities while also enjoying the high antenna gain of the invention in order that all pertinent meteorite trails can be analyzed and be used for data transmission. In the known methods, on the other hand, which employ high antenna gain and an entailed high directivity, the region of observation is restricted because of said high directivity and thereby also the number of meteorite trails relevant for transmission will be markedly restricted. In this manner the invention allows substantially increasing the channel capacities of transmission systems based on meteorite propagation.

On the other hand the advantage of the method of the invention is that the associated ellipsoid tangential to the a meteorite trail can be determined during the time of measurement of said trail. Following determination of the ellipsoid, having the knowledge that the stations taking part in the transmission are located at the ellipsoid foci, the spatial localization of stations taking part in transmission is made possible.

In a further development of the above implementation of the invention, at least two signals reflected from or diffracted by the meteorite trails of different meteorites can be received by simultaneously selecting at least two directions of observation or regions of observation. As a result several footprints can be simultaneously serviced at the receiving side in common channel operation.

Further advantageous and appropriate implementations of the invention are stated herein.

The invention is elucidated below in relation to the attached drawings showing illustrative modes of implementation.

DETAILED DESCRIPTION OF THE INVENTION

Figure 1:
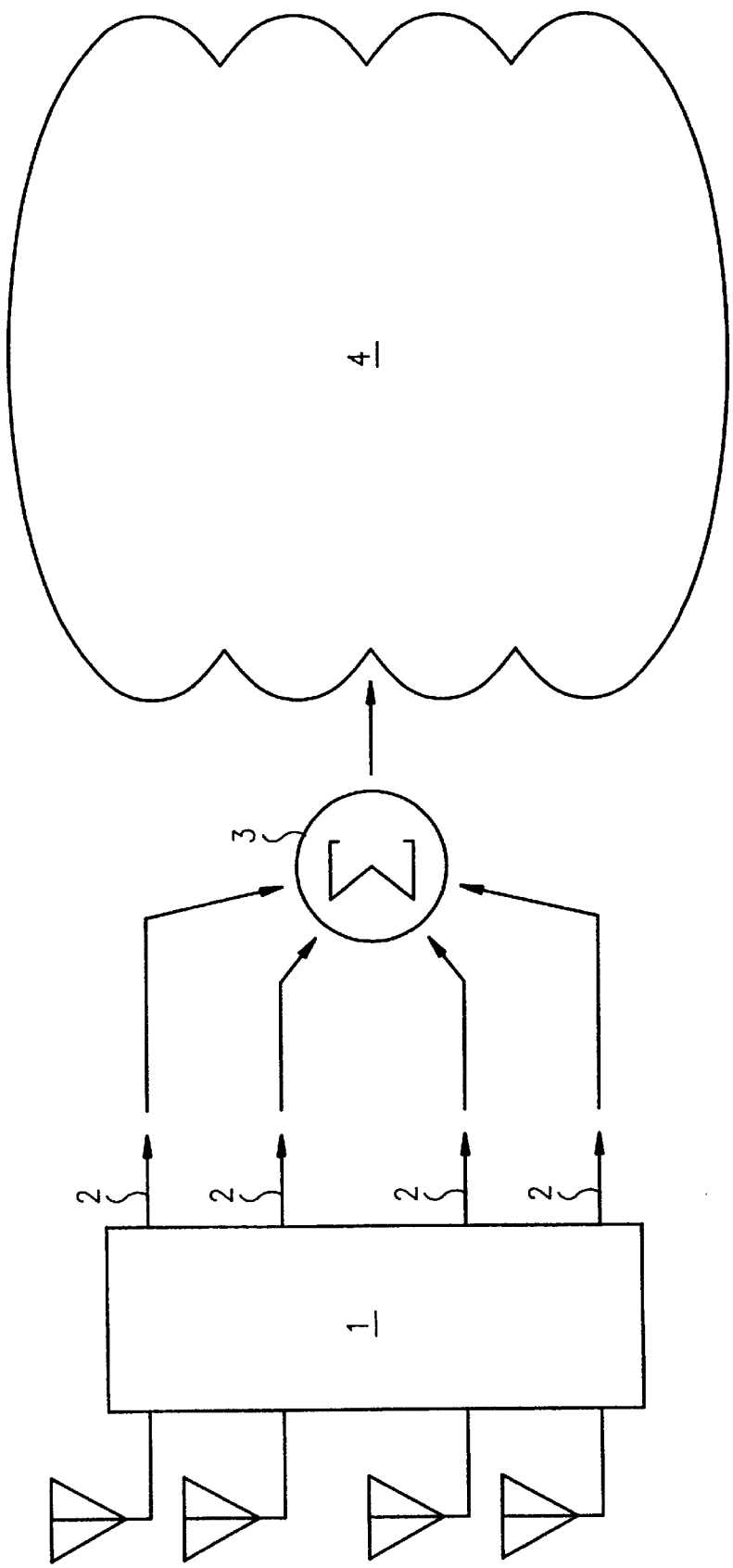
FIG. 1 illustrates a non-redundant main signal space formed by recombining and summing the outputs of devices shaping fan beams.

The Figures of the drawings are schematic and show that in actual apparatus composed of a number of operationally required functional groups, the intersection sites of individual method sequences can be implemented or localized at design-appropriate sites of the actual receiving or analyzing unit.

The pictographs shown in the Figures occur when implementing the method as time signal sequences and are used herein for illustrative purposes to elucidate different signal sequences and signal spaces.

The invention forms a so-called main signal space from a predetermined number of fan beams, hereafter also abbreviated as fan beams, and from said space a measure is taken of the extent each fan beam contributes to the received power or energy. If this information is known for each fan beam that is under consideration, then, for instance by correlating individual fan beams, an intersection zone will be formed which in turn provides a measure of which portion the intersection contributes to the received power or energy of the fan beams participating in the intersection zone. Technical steps of combination then determine which portion the intersection zone contributes to the total received power or energy associated to the main signal space.

Thereby the determination of the received power or energy relative to each direction of observation is implemented free of confusion, that is free of ambiguities caused by power or energy incident from other directions, and will be unambiguous relative to any other signal source in other directions of the intersection zone.

The definition of correlation is a technical process wherein two signal sequences are multiplied by each other in an appropriate analog or digital apparatus. An optional ensuing averaging may be assumed as infinitesimal where needed, whereby the correlation in actual technical apparatus may be considered multiplication and the averaging where called for might further be determined by a finite, frequency bandwidth. The correlating means are shown in the Figures by the multiplication sign. Where called for, substantial times of integration must be designed into the apparatus.

The expression "intersection zone" is the set shown in the plots of those fan beams or cones of which the mutual penetration mainly, but not necessarily exclusively, is determined in a given main beam direction.

Directions or spatial direction values also are those which map the intersection zones and fan beams in affine reproduction and two-dimensionally on surfaces.

The technically understood "signal" denotes all functions physically representable in time that can be picked up by a sensor system. Illustratively the signals may be generated by electromagnetic radiation, in particular being hf signals, they may be acoustic, from heat radiation or radioactivity. The function implemented by the method therefore comprises not only the processing of spectrally discrete signals, but also includes the processing of spectral noise signals or combinations thereof.

Preferably the method is based on an antenna or sensor system with unfilled apertures and a predetermined quantity of fan beams in freely predeterminable distribution. This set of fan beams and of directions of radiation is assumed ad hoc as being rigorously and unambiguously predetermined for at least one measurement stage. Hereby the method of the invention is defined by its function relative to so-called estimation procedures which generally seek improving the radfiation-pattern properties. Furthermore the method of the invention is defined relative to estimation procedures, adaptive procedures or similar procedures in that the functional sequence runs wholly deterministically without iterations or feedback.

It is the introduction of these technical presettings which makes it possible to resolve the ambiguities encountered in the known methods by means of a signal-space structured method of very high processing rates.

Herein the concept of "signal space" replaces the concept of "radiation pattern" because the method of the invention does not classically process the radiation pattern but the time signal sequences recorded thereby and combined in signal spaces. The concepts as a rule will be identical in processing, but not in the result of the intrinsic method function.

Each individually predetermined fan beam as well as each intersection zone radiation pattern formed by correlation thereby correspond to a signal space which can be classified according to type of radiation pattern and which in turn may be formed of additional signal spaces. The method forms additional signal spaces and therein leads to further correlations.

An essential part of the method of the invention is the formation, or creation of at least one main signal space which must evince a special nature and which entails a secondary condition to the above cited antenna system. A main signal space comprises the sum of all pertinent predetermined fan beam plots in such a form that each fan beam is an element of the main signal space and maps itself therein. The object of the main signal space is to represent the total incident signal power or energy from the entire region covered by all selected fan beams.

The fan beams may be used to form the main signal space. Illustratively the main signal space can be formed by vectorially summing all or some of the fan beams. However the main signal space also may be formed from a plot generated by an additional sensor configuration corresponding in shape and weighting to the plot's boundary curve over all fan beams. Such an additional sensor is optional in the method, for instance being an additional antenna when hf signals are involved.

Because each fan beam ideally shall map itself identically in the main signal space, care must be taken when configuring the fan beams that in particular a vectorial summation in over all intersecting fan beams shall result in a weighting in the intersection zones.

Illustratively two mutually intersection fan beams result, by means of the increased directionality in the intersection zone caused by the combination, in a plot-determined weighting of 3 dB. This weighting may be advantageous in the method, or it may be optionally reversed through the selected fan-beam configuration depending on the requirements in the end result.

Figure 2:
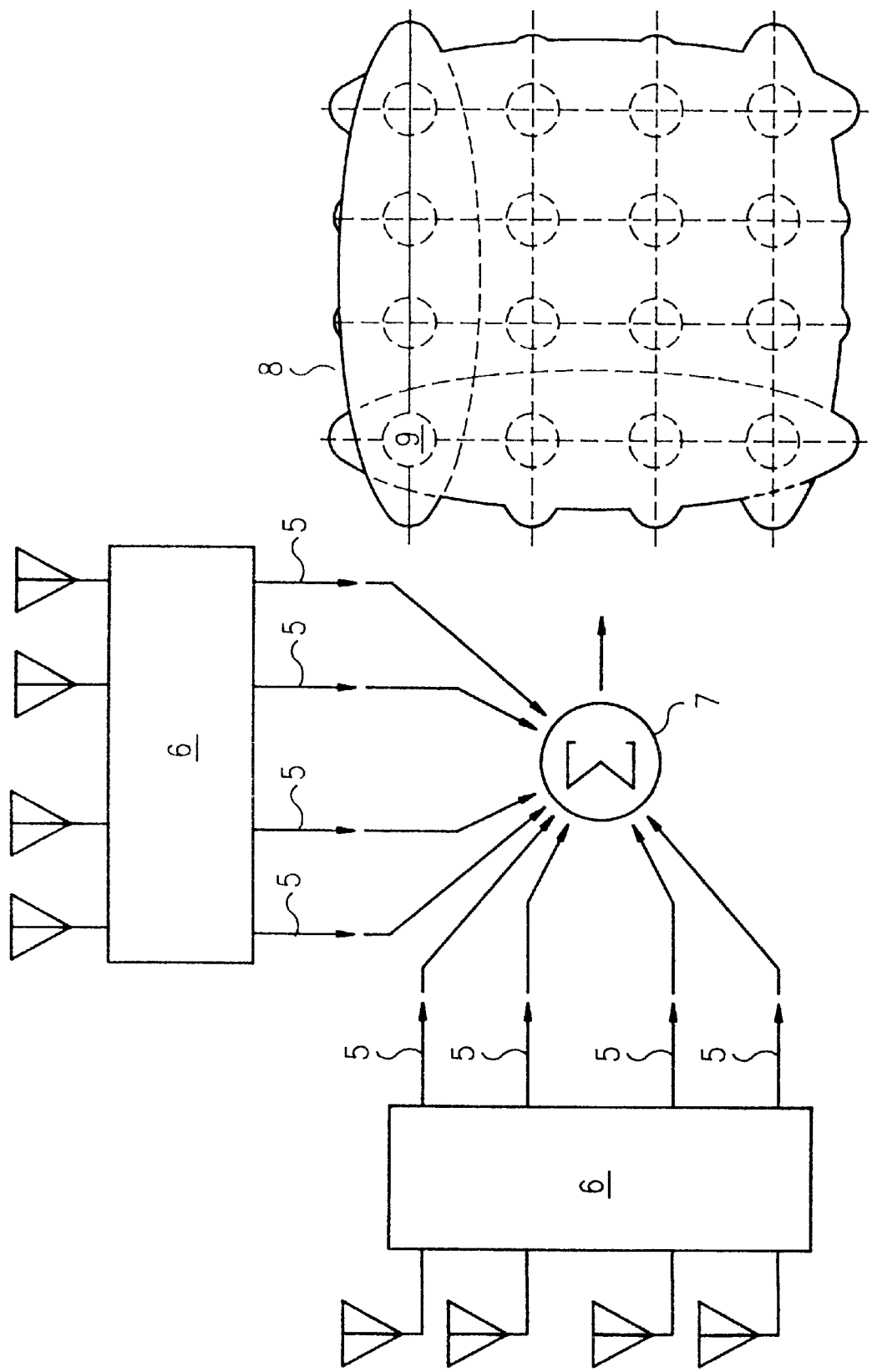
FIG. 2 illustrates the formation of a redundant main signal space by recombining and summing the outputs of devices shaping two fan beams.

A main signal space formed by mutually intersecting fan beams shall be denoted as being redundant. FIG. 2 illustrates the generation of such a redundant main signal space 8 by recombining and summing 7 the outputs 5 of apparatus 6 forming two fan beams 5 which penetrate one another in intersection zones 9. The summation 7 results in weighting the intersection zones 9. More than two apparatus 6 forming fan beams is possible. The fan beams 5 forming the main signal space 8 need not necessarily be identical in shape or weighting.

The formation of a redundant main signal space may be simplified by providing an equal number of identically shaped fan beams for each individual intersection zone. Essentially identical intersection zones of equal weightings will then result.

A non-redundant main signal space avoids additional weightings over the total region in that mutually penetrating fan beams (the definition regarding mutually penetrating radiation fan beams relative to the plot properties of actual configurations of antennas or sensors with finite side-lobe suppression applies here) to form the main signal space are precluded. FIG. 1 shows a design for generating a non-redundant main signal space 4 by recombining and summing (3) the outputs 2 of apparatus 1 forming a fan beam. The fan beams 2 forming the main signal space 4 need not necessarily evince the same shape or weight.

Accordingly a non-redundant main signal space is formed by the sum of that number of not intersecting fan beams which as partial quantity of the number of fan beams selected from the total system correspond to the predeterminable spatial total distribution or overlap.

A non-redundant signal space offers the advantage that the fan beam plots will be mapped therein relatively accurately and weighting is not introduced. The definition relating to mutually penetrating fan beams in actual antenna or sensor configurations applies similar to the concept of weighting.

Figure 3:
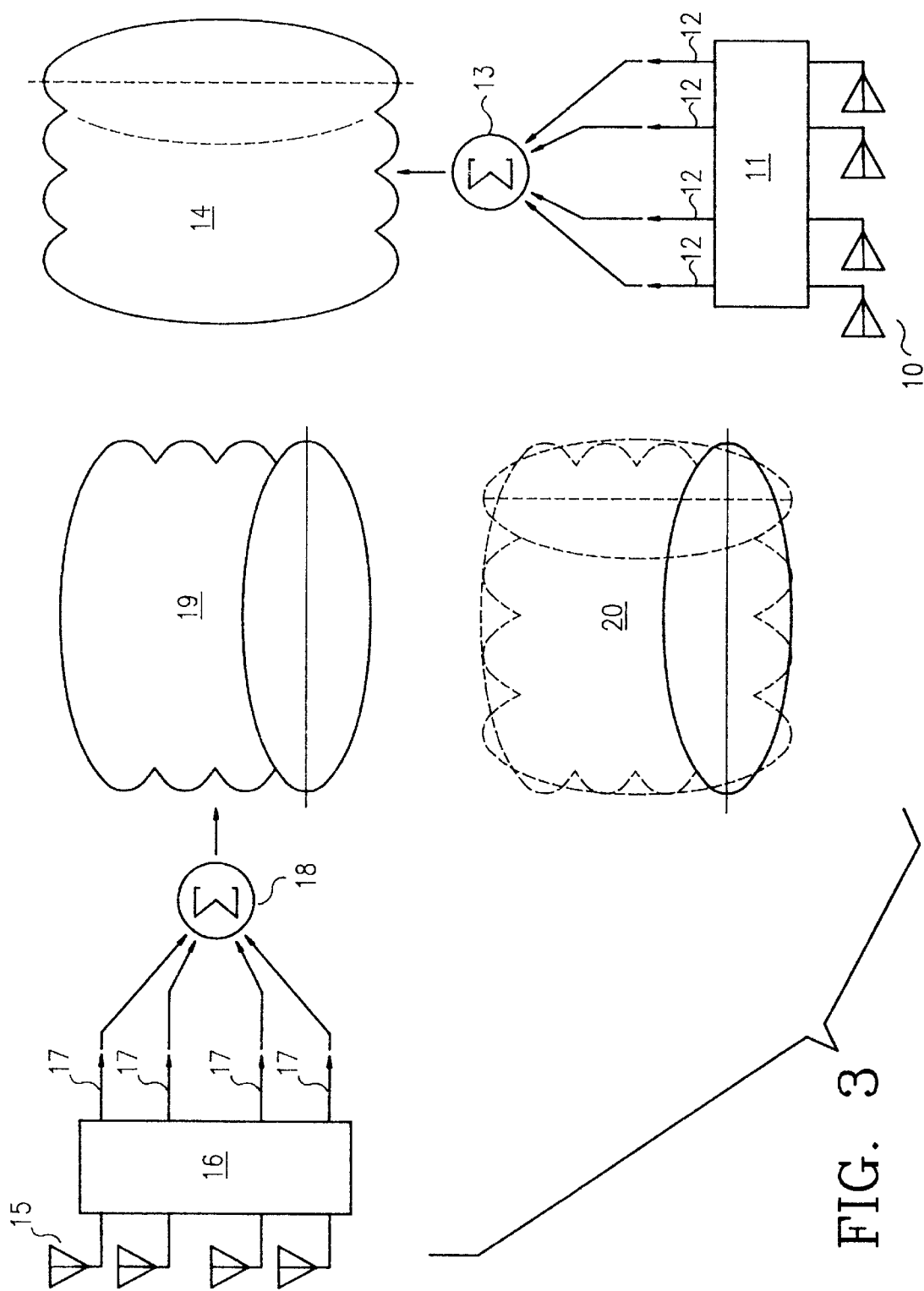
FIG. 3 illustrates forming complementary, non-redundant main signal spaces.

The complement of a non-redundant main signal space is that portion of fan beams from a total system which penetrate said system in intersection zones and, moreover being combined, but which themselves do not form a redundant main signal space. FIG. 3 shows a design for forming complementary, non-redundant main signal spaces 14, 19. Two illustratively mutually orthogonal rows 10, 15 of antennas or sensors each in a beam-shaping device 16, 11 form a number of fan beams in the x-coordinate direction 17 and a corresponding number of fan beams in the y-coordinate direction 12 which by being summed at 13, 18 form corresponding non-redundant main signal spaces 14, 19. The main signal space 14 and the main signal space 19 are complementary. In actual application physically unavoidable shortcomings when forming plots, for instance finite side lobe suppression in the fan beams, will have to be taken into account, for instance overlap at the edges, if illustratively the main signal space 14 and the main signal space 19 as shown in the Figure by reference 20 are mapped into one another.

If complete overlap by all possible intersection zones or fan beams 12, 17 is not required, then the redundant main signal spaces 14, 19 do not need to map into one another completely identically either. Accordingly the concept of "complementary" is relative to the degree of the complement corresponding to a scale.

The method of the invention furthermore may cover the case of only one non-redundant main signal space, for instance either the main signal space 14 or the main signal space 19 being used for analysis. Taking into account the degree of the complement, this complement to a non-redundant main signal space will not be mandatory. The overlap region can be predetermined ad hoc for redundant main signal spaces.

Furthermore other complementary, non-redundant main signal spaces than orthogonal mutually penetrating fan beam configurations, also with more than two rows of antennas or sensors, may be designed. The sketch relating to reference 20 in FIG. 3 shows an example of a mutually independent but nevertheless essentially same spatial overlap, on one hand by the main signal space 14 and on the other hand by the main signal space 19, corresponding to the high degree of the complement.

Be it borne in mind, however, that summing the main signal spaces 14 and 19 would create an independent, now redundant main signal space in the edge zone of 20. In other words, a non-redundant main signal space ideally complementary to another, non-redundant signal space, is composed of another partial quantity of those fan beams which likewise do not intersect themselves and in the ideal case likewise overlap the predetermined spatial distribution but on the other hand are the complementary intersection-zone fan beams for the other portion of the main signal space. Because of their identity, fully, i.e. ideally complementary non-redundant signal spaces may be considered, because of their identity, being mutually independent as a main signal space. Possibly more than two signal spaces will form complementary main signal spaces. Ideally complementary non-redundant main signal spaces rigorously map into one another with respect to their total distribution.

In particular the invention also allows that two or more non-redundant main signal spaces participating in one system be less than mandatorily fully complementary and therefore need not form a precise complement to each other. In other words, "complementary" also shall denote those non-redundant main signal spaces which comprise partial quantities that are not an element of another non-redundant main signal space participating in the system.

The invention merely requires at least one intersection zone composed of one fan beam of the one, non-redundant main signal space and one fan beam of another main signal space. Illustratively there might be two non-redundant main signal spaces, which furthermore may be of different sizes, comprising a single intersection zone as the sole common element, said zone being formed by two fan beams projecting each from one of these main signal spaces.

Figure 4:
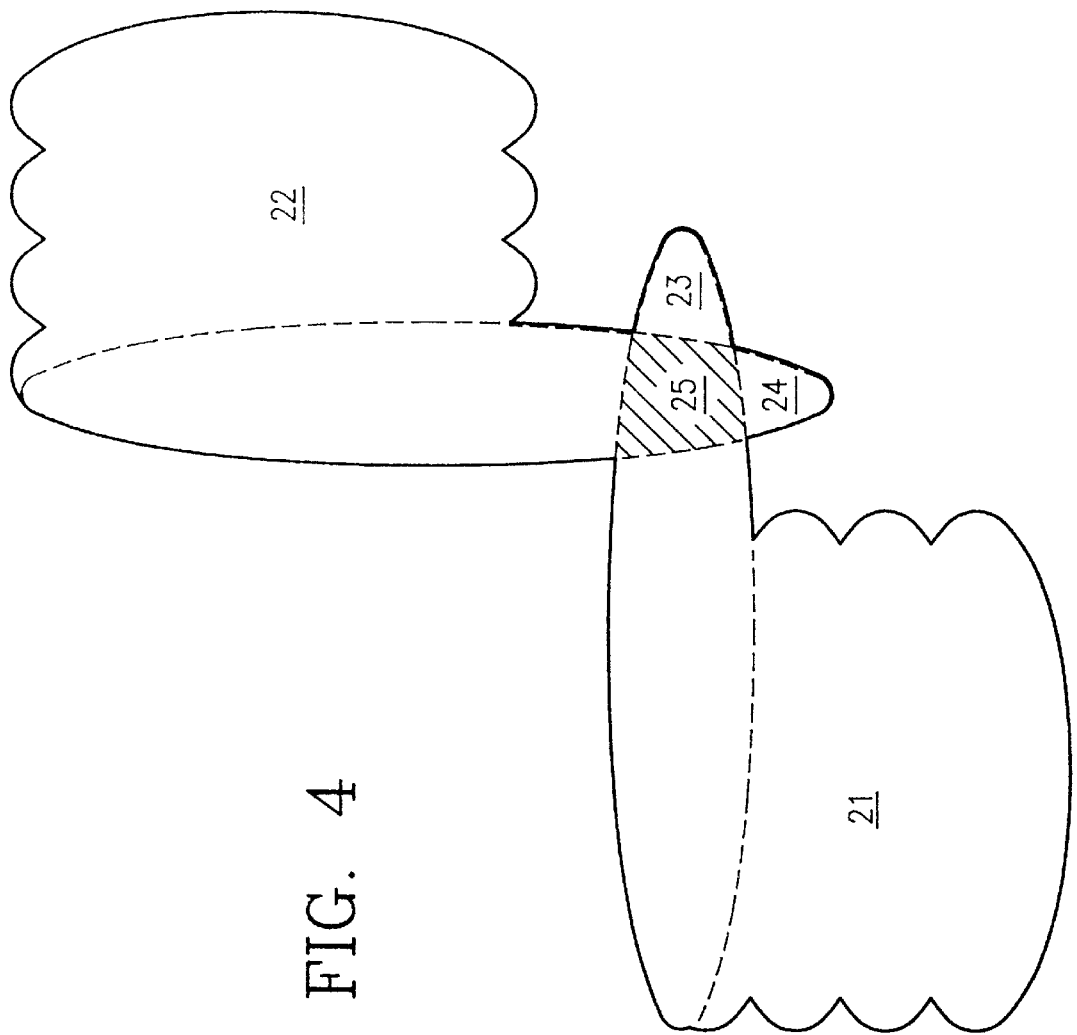
FIG. 4 illustrates an extreme case of two not entirely complementary non-redundant signal spaces only intersecting in an intersection zone constituted by two fan beams from the particular main signal spaces.

FIG. 4 is an example of such a case of two not fully complementary non-redundant main signal spaces 21 and 22 intersecting only in one intersection zone 25 of two fan beams 23, 24 of the particular main signal spaces 21, 22. In the case of less than fully complementary, non-redundant main signal spaces, the fan beams 23, 24 may achieve comparability with the intersection zone 25 by determining the ratio of the power or energy level contained in 21 and 22. The method of the invention furthermore being able to determine what the contribution from each fan beam 23, 24 is to the total power or energy of the associated main signal space 21 or 22, the fan beams 23, 24 weighted by this ratio can be made to provide an unambiguous result regarding the intersection zone 25. The method of the invention making it possible first to determine the power or energy level for each of these fan beams that the particular fan beam contributes to its own main signal space, it is possible also to determine the contribution from the intersection zone to the absorbed total power or energy once the ratio of the total power or energy held in these main signal spaces is known. The combined total power or energy in a particular non-redundant main signal space from the associated number of fan beams therefore must be incorporated into the ratio of the total power or energy combined in the other main signal spaces participating in the system. The point here is not to ascertain which amount one main signal space contributes to a possibly combined power or energy from all main signal spaces, rather it is to determine what is the ratio of the total power or energy of a single non-redundant main signal space to the whole of the total power or energy of another non-redundant main signal space participating in the system.

In principle all known analog or digital procedures to form the power or energy level ratios may be used and consequently, in the event of forming the ratio of non-redundant main signal spaces, the method of the invention also allows mathematical division.

Otherwise the method does not require mathematical division. As a result of mathematical division, the total power or energy may be larger by a factor "x" in a non-redundant main signal space than the total power or energy of another non-redundant main signal space. The comparability of non-ideal, complementary non-redundant main signal spaces is especially advantageous with respect to actual antenna or sensor systems which, on account of actual pattern particulars, do not provide an ideal complement of individual, non-redundant main signal spaces.

It must also be borne in mind that in principle the complementary, non-redundant main signal spaces can be combined, however one must then consider that this entails abandoning the non-redundant principle of main signal spaces because in such a case the combined main signal spaces would introduce mutually intersecting fan beams in the sense of redundant main signal spaces.

Also those shapes shall be applicable as main signal spaces wherein said spaces degenerate or have degenerated into fan beam shapes. In other words, if the whole system consists of a minimum configuration of only two intersection fan beams, then each fan beam per se forms one non-redundant main signal space and, in the case of the two fan beams being combined, correspondingly forms one main signal space. Because by definition two single mutually penetrating fan beams form one intersection zone and as a rule will not identically map therein, two single fan beams considered being non-redundant main signal spaces therefore also are not completely mutually complementary. In order to arrive at the result desired by the method of the invention for the intersection zone, even in the case of two individual fan beams representing main signal spaces, combination must be established between the correlated intersection zone, the fan beams, ie the corresponding main signal spaces. It can be shown thereby that the method systematy also is consistently applicable to that case wherein main signal spaces degenerate into fan beams or are directly represented by these. Aside the still required combination for procedures or apparatus corresponding to the function of combination probability computations, it is clear, especially for the case of forming a redundant main signal space, ie it is required by the method systematy, that two fan beams representing the minimum configuration still must be combined. Accordingly the method of the invention also includes the case of special shapes of the main signal spaces. As a consequence, this also applies to main-signal space configurations which were combined in permutated manner and which were formed in stepwise enlarged manner.

In order to carry out the method of the invention, a main signal space may be formed using a corresponding additional antenna or by means of the available fan beams.

The latter option can be implemented by forming a redundant, however also a non-redundant, main signal space.

A Butler matrix is an illustrative device with which to generate a main signal space, said matrix providing at its outputs a number of directionally consecutive fan beams. The division into directions generated by the Butler matrix is reversed by vectorially summing the output signals, resulting in the sum of the radiation plots (fan beams) formed by the Butler matrix. Obviously this combination can take place at any arbitrary site which is meaningful in the functional sequence of an actual receiving or analyzing unit. In this example the shape of the main signal space may be considered being the bounding curve around all fan beams formed by the Butler matrix. The signal space then would be non-redundant because the Butler-matrix fan beams would not mutually intersect. Accordingly the definition applies regarding mutually penetrating fan beams as regards the plot properties of actual antenna or sensor systems with side-lobe suppression.

The complementary main signal space would be formed from the sum of the fan beams of an identical second Butler matrix which however is orthogonal to the first Butler matrix. Obviously the same results may be achieved using another analog or digital beam shaping system, for instance a network.

Basically main signal spaces may be generated in the invention from all conventional and known analog as well as digital methods or apparatus for plot-processing systems of antennas or sensors as well as fan beams produced thereby.

The results from the method of the invention are obtained for instance using various correlation procedures within the signal spaces in order to form values which in further method stages shall be chained in desired manner to unambiguous measurements.

The method uses the conception that all signal spaces may consist of a quantity of spectral-noise time signals, each signal space in turn being sub-divisible into multivariate, spectral-noise spaces.

If for instance two mutually independent gaussian-noise signals are assumed and are combined, then there results again a so-called bivariate, gaussian noise signal. Assuming that both noise signals evince the same expectation value because of a center frequency, then the time signal sequence will further be mutually independent, but the variance of the newly formed bivariate gaussian noise signal will be unambiguously ascertainable from the covariance of the output signals. If several noise signals are combined, these will correspondingly form a multivariate signal space.

Because the method measures the received power or energy, a discrete signal on the frequency axis also may be considered being a signal with a null-tending variance which is quite approximately to the nature of actual, technical signals. Illustratively the method of the invention may include the determination of a measure of the received power or energy, for instance the determination of the relative or percentile received power or energy relative to a higher-order signal space corresponding to a main signal space.

Determination of the absolute value of the received power or energy in a direction observation may be carried out in such manner that the total absolute received power or energy held in the main signal space shall be determined merely in one measurement step and that thereby scaling of the relative measurements is possible.

Figure 6:
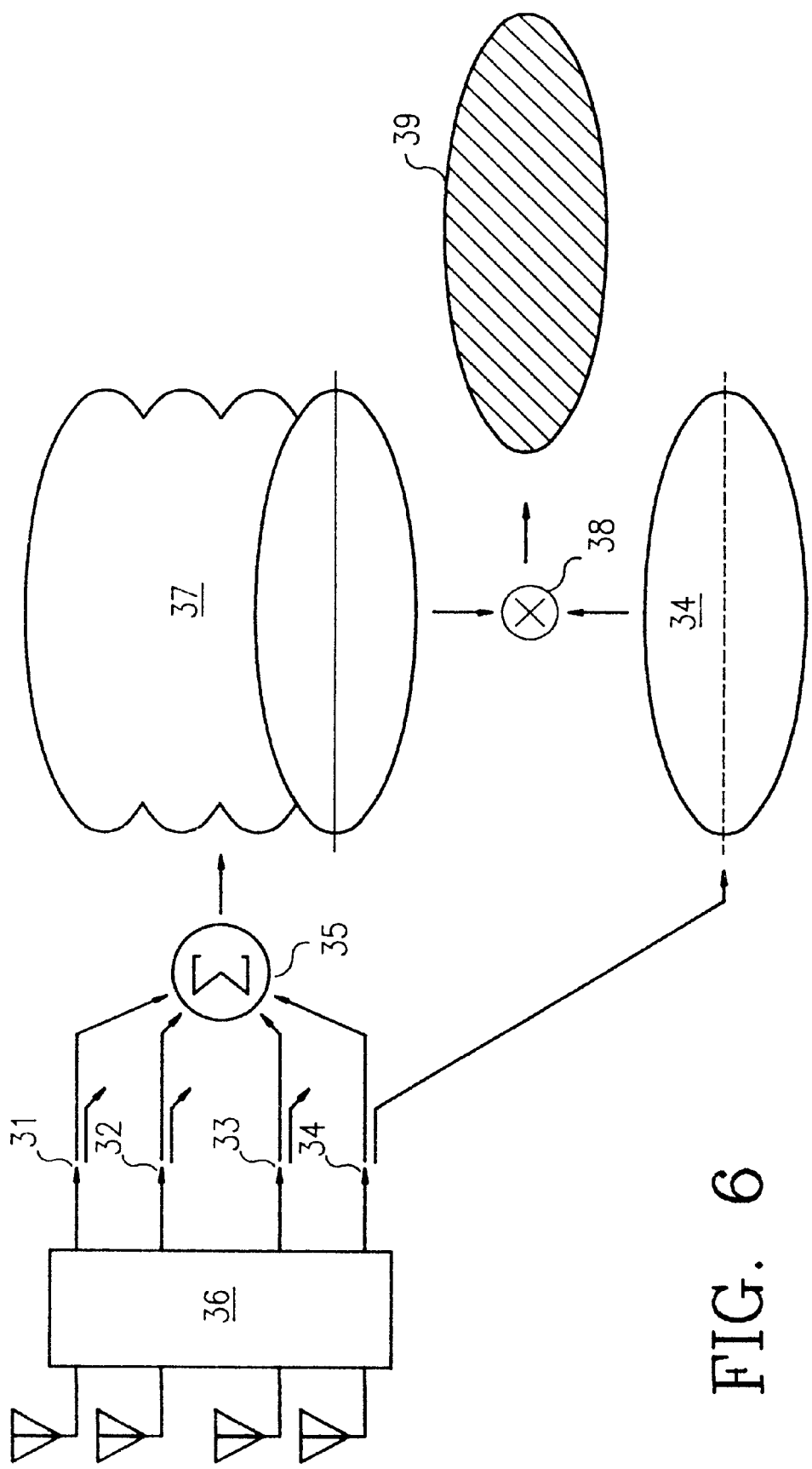
FIG. 6 illustrates the formation of a fan-beam signal space by correlating a non-redundant main signal space with a fan beam.

An essential component of a preferred implementation of the method of the invention is that each fan beam shall be singly correlated with the main signal space. FIG. 6 shows the formation of a fan-beam signal-space 39 formed by the correlation 38 of a non-redundant main signal space 37 with a fan beam selected from the references 31 through 34, in this case illustratively the fan beam 34. To form a fan-beam signal-space 39, redundant main signal spaces are similarly suitable and admissible. The correlation result represented by the fan-beam signal-space 39 is a probability measure of the contribution of the fan beams 34 to the total power or energy absorbed in the main signal space 37. The fan beams 31 through 34 forming the main signal space 37 need not be identical or be equally weighted. The fan beams 31 through 34 are formed in the fan-beam shaping device 36. The main signal space is formed by vectorially summing (35) the fan beams 31 through 34. The nature of the correlation result being a statistical measure which can be converted into a probability, a percentage or a variance, then correlating a fan beam 34 with the main signal space 37 will provide information about the received power or energy held in the fan beam in relation to the total power or energy held in the main signal space.

There results a newly formed fan-beam signal-space 39 indicating to what extent it contributed to the total received power or energy held in the main signal space.

Figure 5:
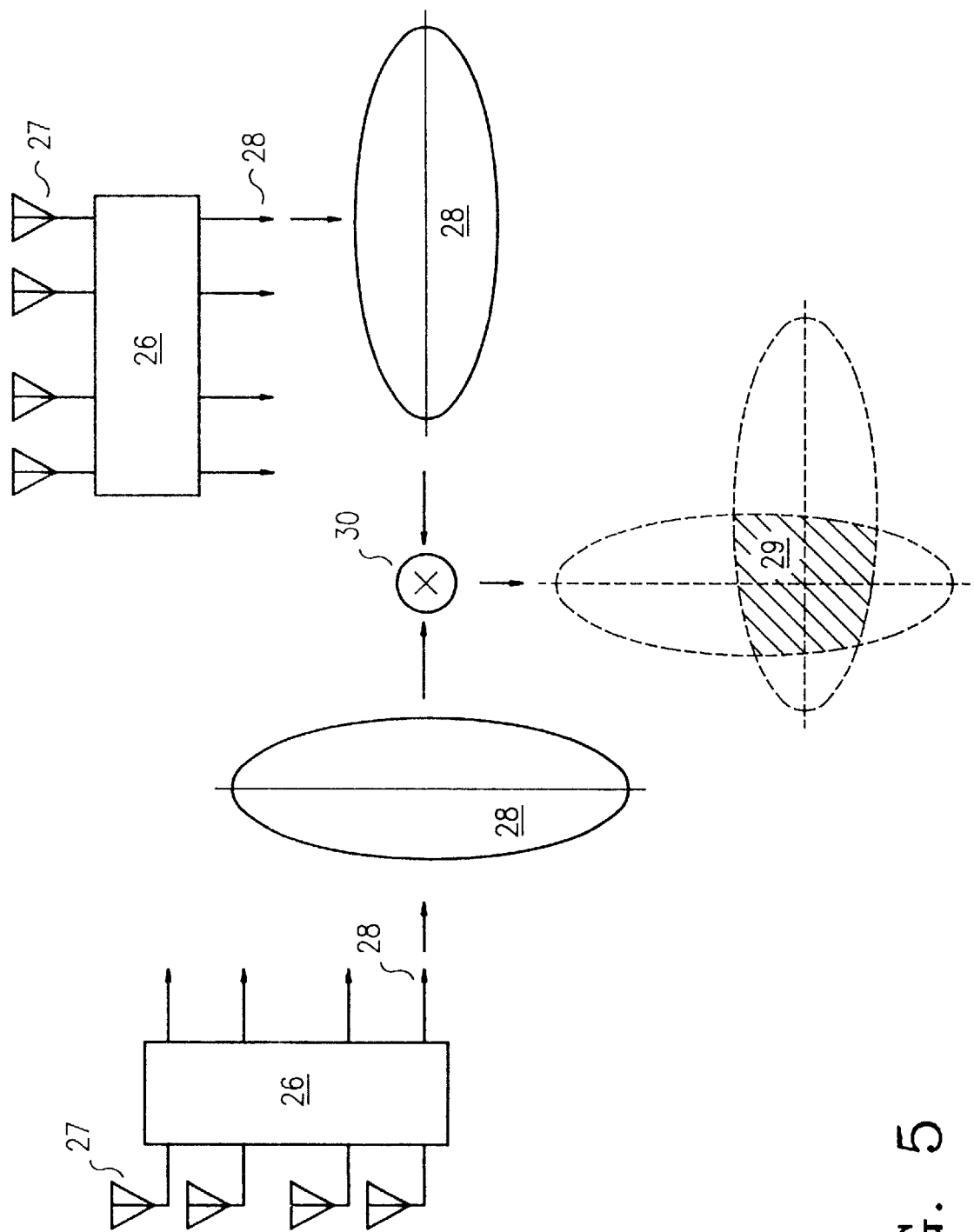
FIG. 5 illustrates forming an intersection-zone/signal-space by correlating two mutually penetrating fan beams.

Whereas the main signal space represents the uppermost step of the signal space in the system, the intersection zones are present at the lowermost signal-space step. A particular intersection-zone signal-space is generated by correlating the fan-beam shaped radiation patterns (fan beams) produced by the apparatus and participating in the formation of the intersection zone. FIG. 5 shows the formation of an intersection-zone signal-space 29 by correlating (30) two mutually penetrating fan beams 28. The correlation result represented by the intersection-zone signal-space 29 is a measure of the probability of the amount of the contribution by the intersection zone 29 to the power or energy held by the two fan beams 28. The fan beams 28 are formed by the fan-beam shaping device 26 from the signals detected by the antenna or sensor rows 27. This is a partial function of the new method which, while identical in implementation with the known synthetic beam narrowing, in this instance however is not meant foremost to lead to a narrower radiation pattern but shall preliminarily generate an interim value for the further sequence of the method.

Figure 7:
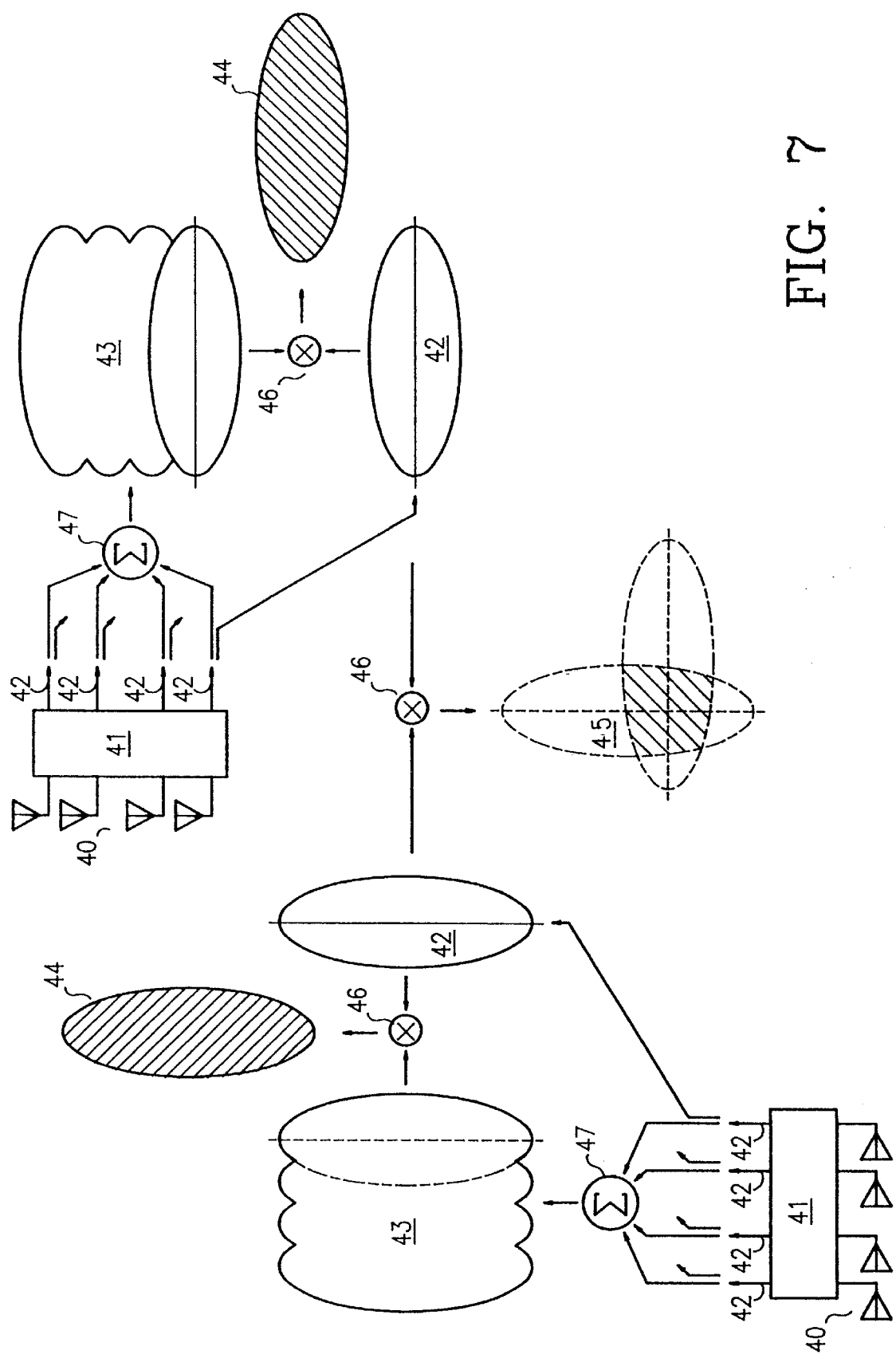
FIG. 7 shows the formation of signal spaces, FIG. 8a schematically shows an illustrative implementation of the method of the invention with complementary, non-redundant main signal spaces and with orthogonal configuration of the fan beams, FIG. 8b schematically shows a further illustrative implementation of the method of the invention corresponding to FIG. 8a but with another coupling (multiplication and summation are reversed relative to FIG. 8a), FIG. 9a schematically shows a configuration for coupling fan beams in the method of FIG. 8a, FIG. 9b is a flow chart for the method of FIG. 8a, FIG. 10 schematically shows a further illustrative implementation of the method of the invention with only one main signal space which may be redundant or also non-redundant.

Corresponding to the correlation between the fan beams and the main signal space, the mutual correlation of the fan beams participating in the formation of an intersection zone also provides a statistical measure of that portion of the received power or energy held in the participating fan beams which applies to the intersection zone formed by correlation (see FIGS. 5, 6 and 7). FIG. 7 shows two systems with mutually penetrating fan beams 42. Both main signal spaces 45 in this case are illustratively complementary. FIG. 7 shows the formation of fan-beam signal-spaces 44, the formation of an intersection-zone signal-space 45 and the formation of main signal spaces 43 from a system of fan beams 42 that are formed by devices 41 shaping the fan beams from the signals received by the antenna or sensor rows 40. The fan-beam signal-spaces 44 or intersection-zone signal-spaces 45 are produced in each case by the corresponding correlation 46. The main signal spaces are formed by combining and summing (47) the radiation fan-beams 42.

The result is a newly formed intersection-zone signal-space, where the outcome of correlating the two fan beams referenced by 42 in FIG. 7 and forming the intersection zone or the intersection-zone signal-space indicates to what extent said zone or said space contributes to the received power or energy held by the participating fan beams 42.

Correlation can be carried out both in non-redundant main signal spaces and in inserted signal sub-spaces. The formed fan-beam signal-spaces are chained in the course of further method sequence with the formed intersection-zone signal-spaces. However no ratios are taken of signal values. Division is not required in the invention.

The method chains the signal spaces produced from correlation with further correlations as well as with known procedures known in probability computation.

Herein procedures of conditional probability processing are considered deterministic to the extent for instance as regards a signal space formed exactly of two signal sub-spaces, one of them contributing 60% to the total quantity and the other then 40%.

It is the nature of the method of the invention to determine with respect to the formed signal spaces and in relation to their content of received power or energy, in the form of probability and by pertinent combinations, the content of received power or energy in one or more intersection-zone space(s) as regards a predetermined direction of observation.

The combination may be carried out using conventional procedures and apparatus allowing combination logic or combination of probabilities. The obtained result is a probability which can be weighted against the absolute received power or energy held in the main signal space.

Figure 13:
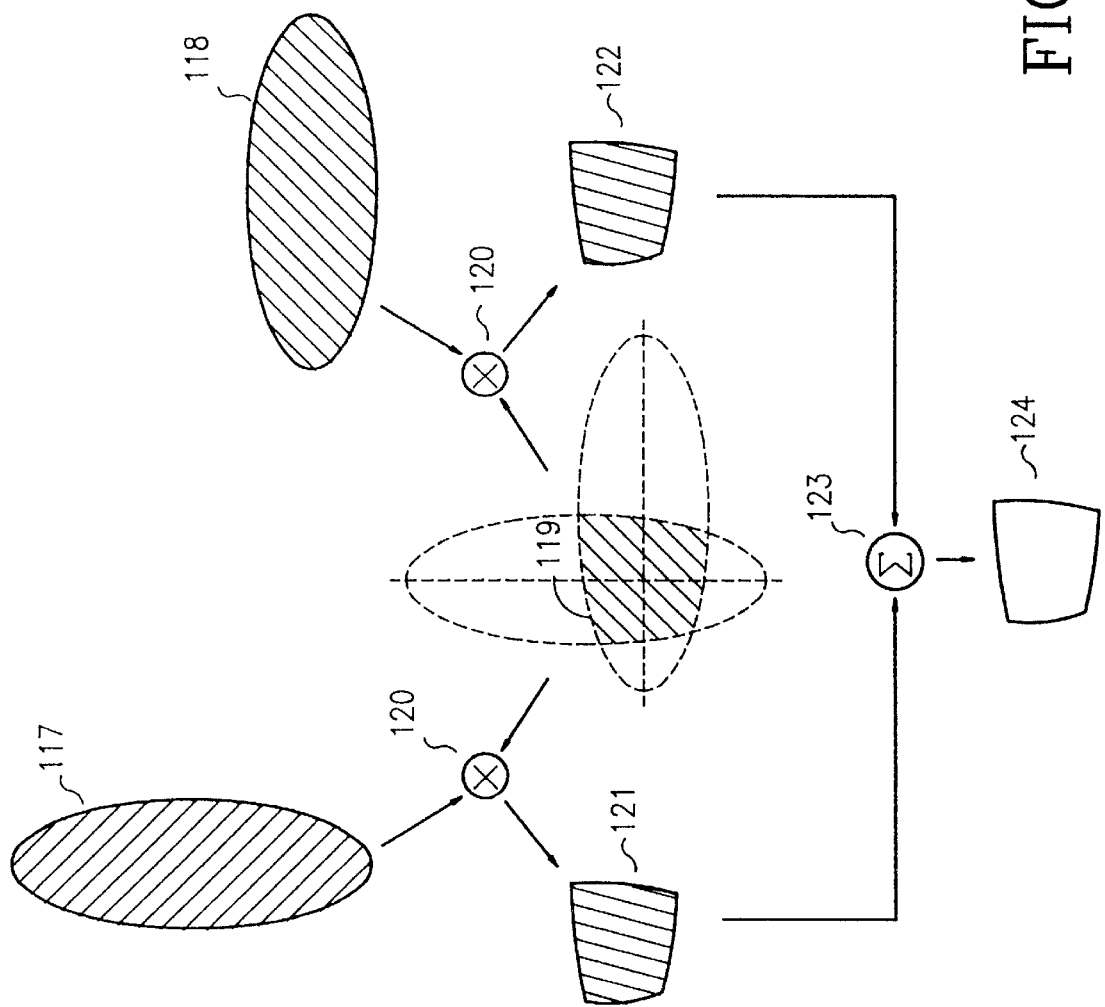
FIG. 13 shows the combination of various signal spaces and interim results.

An example of a combination procedure is to correlate the formed fan-beam signal spaces again with the number of particular pertinent intersection-zone signal-spaces, namely, by definition, optionally by multiplication. FIG. 13 shows an example of chaining the interim results from non-redundant main signal spaces with means of combination probability computation. An intersection-zone signal-space 119 is multiplied once by the radiation fan-beam signal-space 117 and again (120) by the radiation fan-beam signal-space 118. This multiplication can be carried out technically by correlating for an infinitesimally small time of integration. The radiation fan-beams signal-spaces 117, 118 already were previously generated from corresponding main signal spaces and corresponding fan beams (omitted from FIG. 13). The multiplications 120 yield interim results (references 121, 122) which are summed (reference 123) and provide the final result 124 for an intersection zone.

FIG. 13 only shows one example of combination probability combination to obtain a result. The nature and claimed scope of this portion of the method is to create, using means for combination probability computation, for instance corresponding to FIG. 13, a combination of the formed radiation fan-beam signal-spaces 117, 118 with the formed intersection-zone signal-space 119 in relation to a main signal space. Basically, (a) The radiation fan-beams signal-spaces 117, 118 represent a measure of the probability of the amount contributed by the fan beams belonging to 117 and 118 to the total power or energy held by the corresponding main signal space, (b) The intersection-zone signal-space is a measure of the probability of the amount contributed by the intersection zone to total power or energy of the fan beams forming it. The probability for the intersection-zone signal-space can be determined as shown by correlation in FIG. 13, (c) A measure of the probability of which contribution a corresponding intersection zone makes ultimately by means of correlations in the result-combining portion of the method of the invention to the total power or energy held by the main signal space is implemented using known procedures and devices for combination probability computations.

Figure 10:
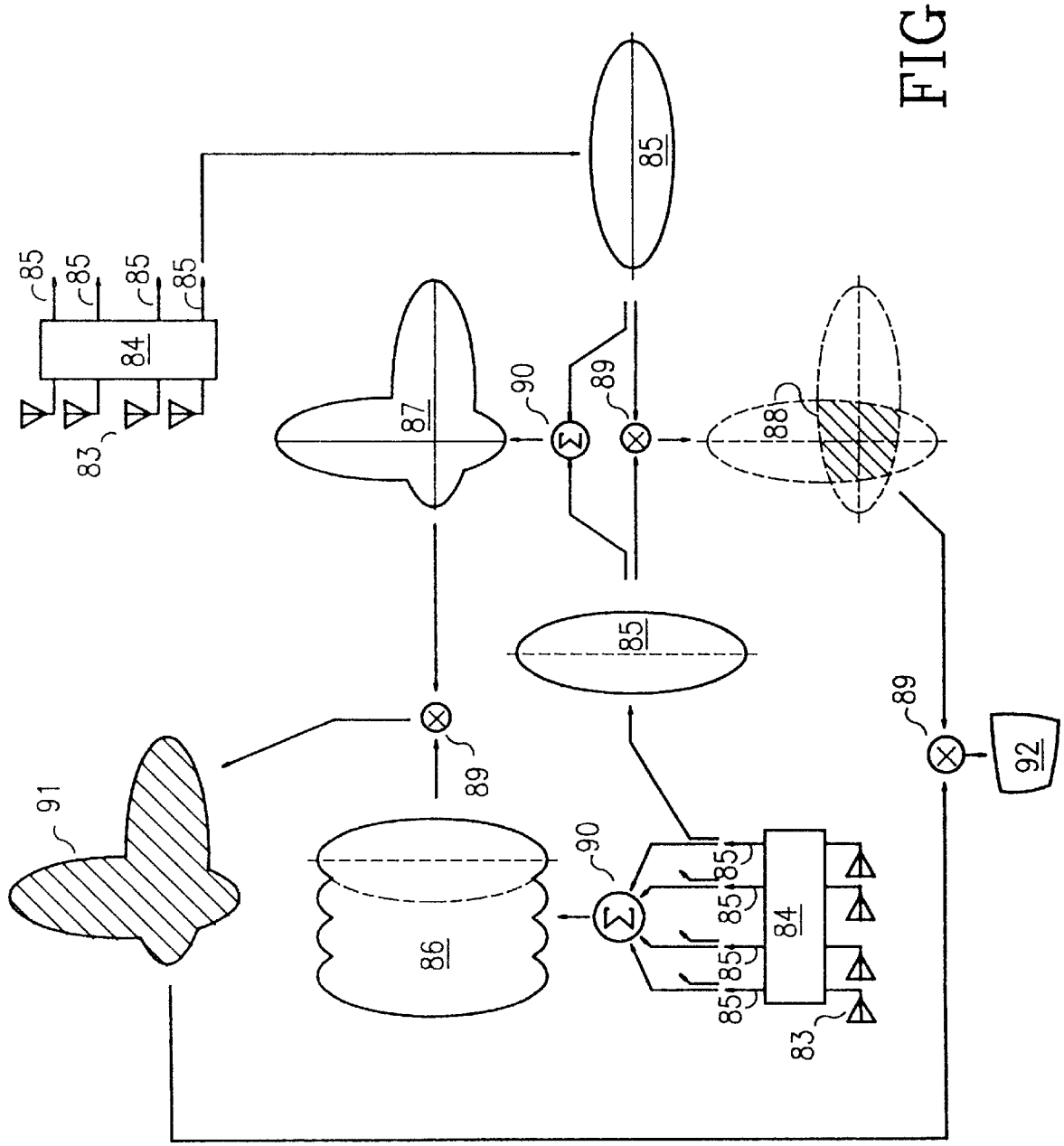

Modifications may be introduced in the method of the invention, wherein signal sub-spaces or accessory signal spaces are formed from and into a main signal space under any other combination ways. Illustratively a signal sub-space or an accessory signal space relating to a main signal space may be formed in that the fan beams participating in an intersection zone can be combined by summing (Example: FIG. 10, reference 87).

The combination technique of the probability measures obtained in interim results must be selected in relation to the requirements of the chosen configuration of the main signal space. Consequently the method of the invention also is applicable where arbitrary permutations of signal sub-spaces are created that lead in the end, in single steps and in the related required other combinations, to the desired result. It is clear therefore that there results again a measure of probability of the intersection zone relative to a particular fan-beam signal space. To arrive at the final result, lastly the ascertained probability measures may be added. An unambiguously defined result is thus achieved for the time being relative received power or energy in an intersection zone of a system of dependent and independent fan-beam spaces.

Figure 8A:
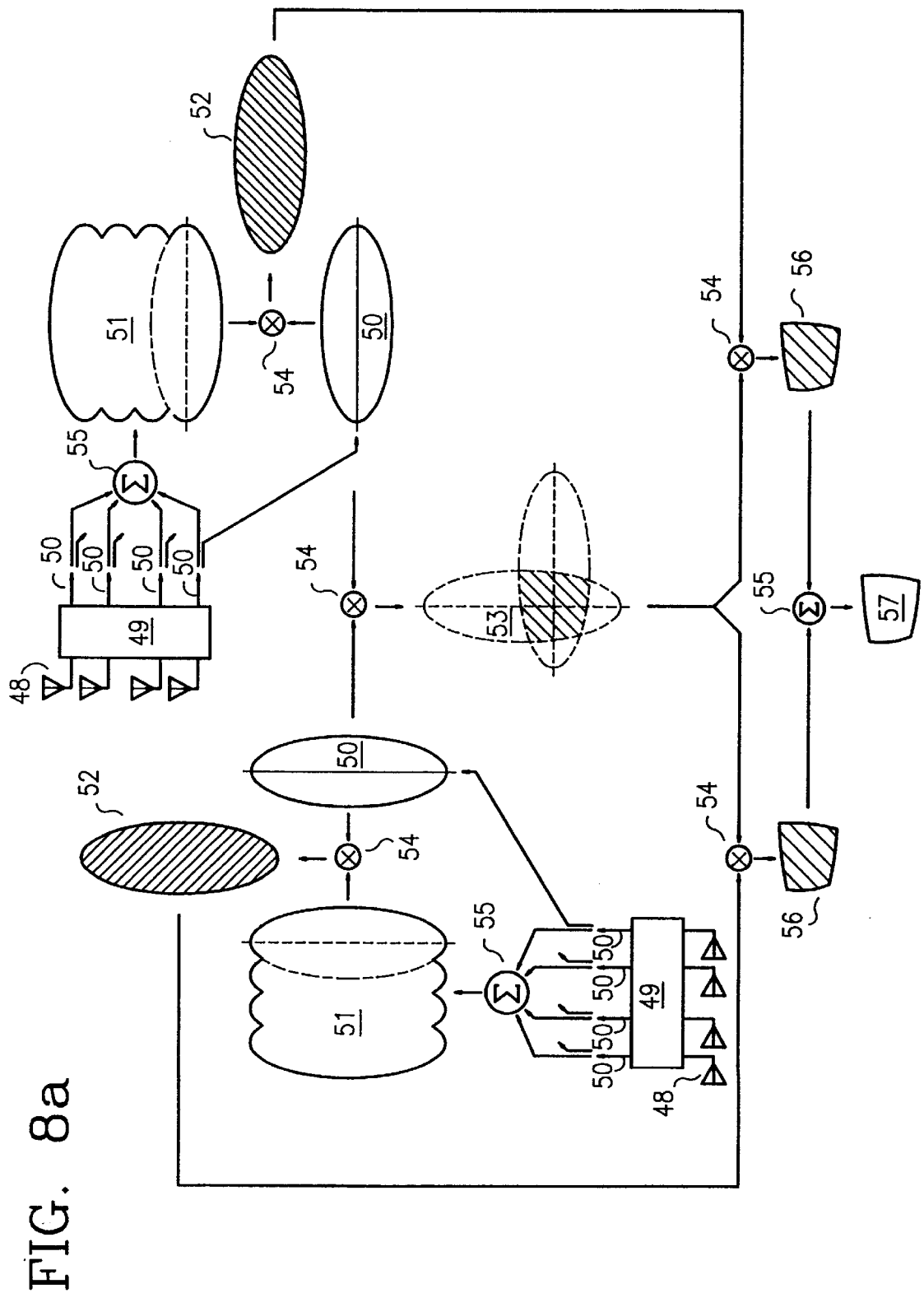
Figure 8B:
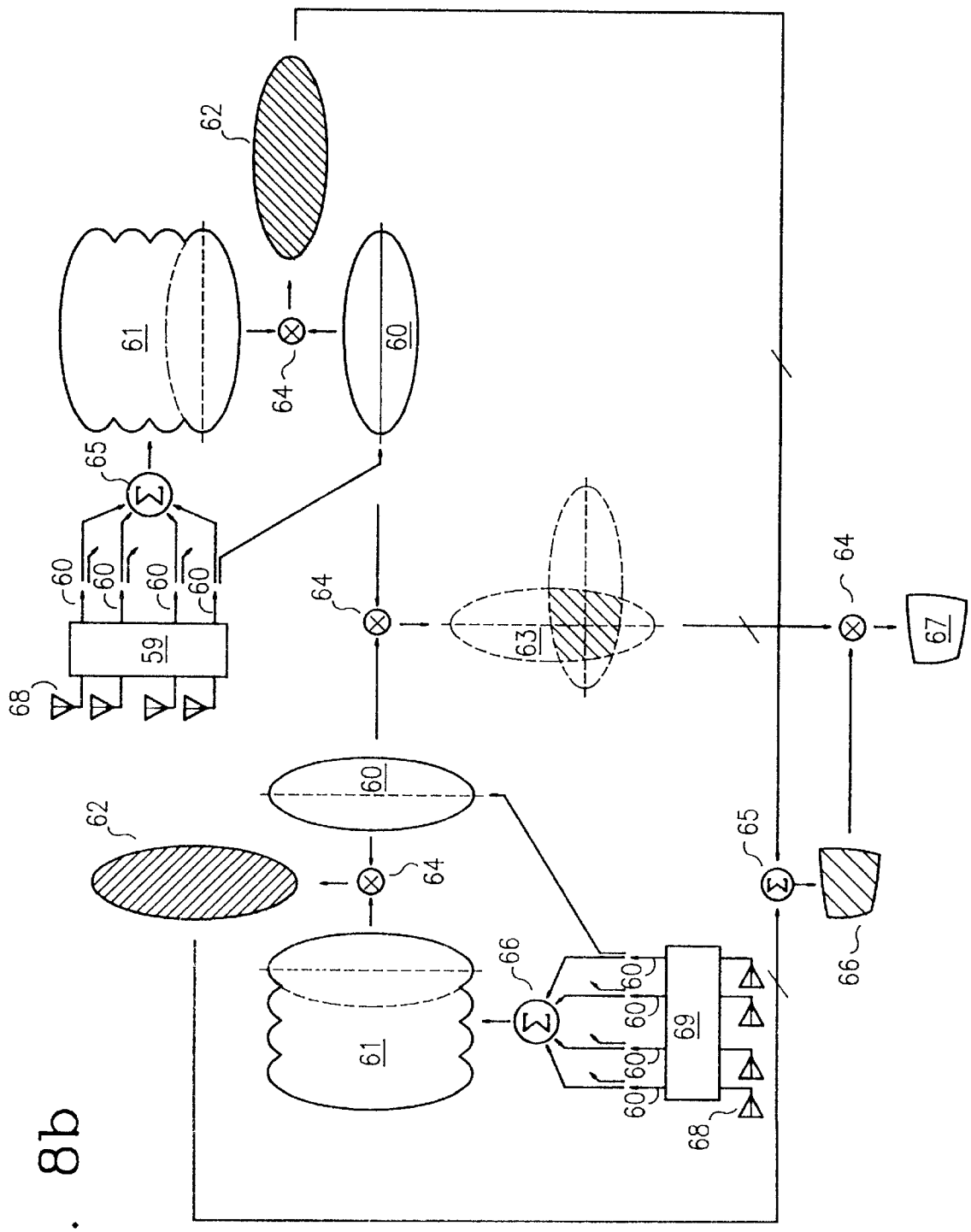
Figure 9A:
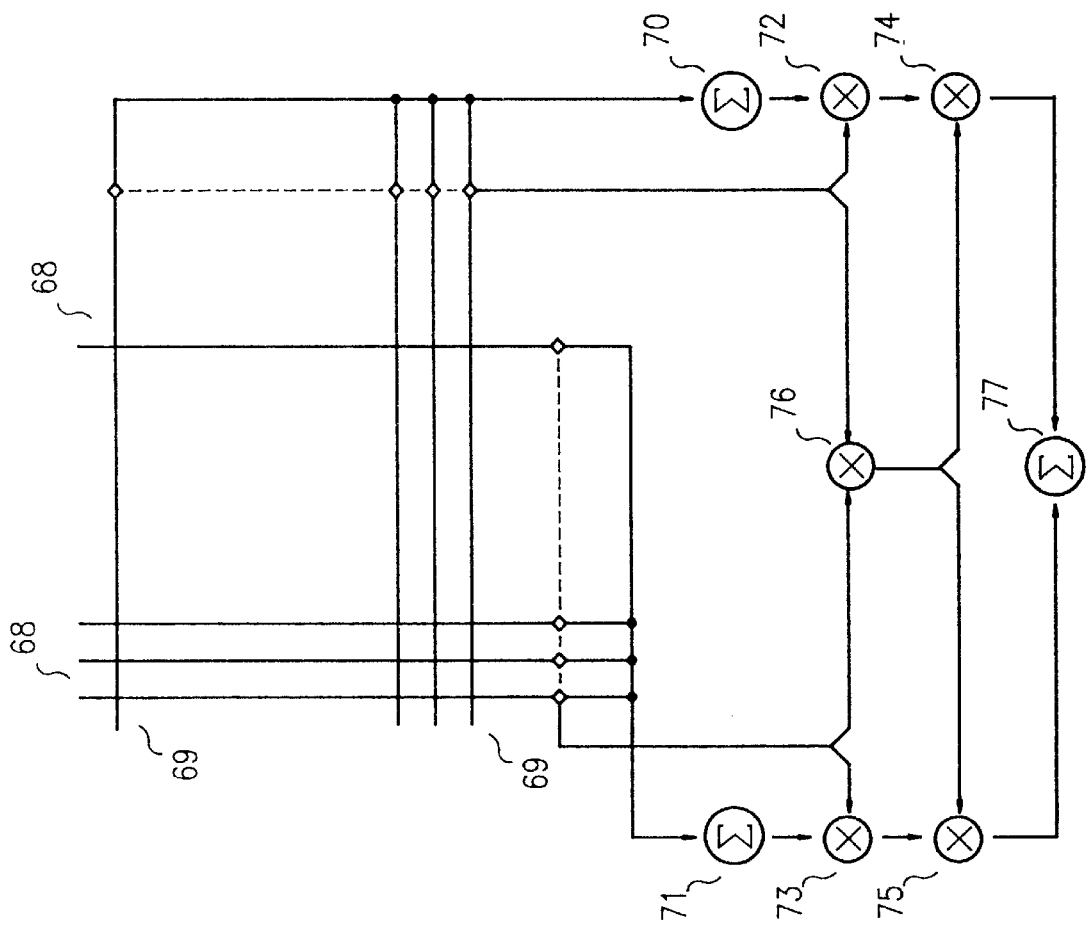

FIGS. 8a, 8b, 9a and 9b show an illustrative implementation of the method of the invention. FIG. 9a schematically shows the combination of signals to implement the method of FIG. 8a and FIG. 9a, and FIG. 9b is a flow chart of the method sequence relating to FIG. 8a.

Identical fan beams are generated by means of suitable steps and a system of antennas and sensors, said beams being mutually orthogonal, that is in the x and y directions. All the horizontal fan beams and all the vertical fan beams essentially overlap a single, common total region of observation. This configuration allows forming a non-redundant main signal space from the x fan-beams and a non-redundant main signal space complementary to the former space from the y fan-beams. All x fan beams then are correlated with the x main signal space and all y fan beams with the y main signal space, resulting in a corresponding number of new fan-beam signal-spaces. In principle it is possible also to form only one complementary portion of the main signal space and to analyze it.

Furthermore all x fan beams are correlated with all fan beams, resulting in a corresponding number of intersection-zone signal-spaces. Thereupon all newly acquired intersection-zone signal-spaces are correlated again with all newly acquired fan-beam signal spaces belonging to the corresponding intersection zone. There results a corresponding number of correlation values for the x fan-beam and for the y fan-beam signal spaces which in the end are summed in relation to belonging to a particular intersection zone.

In particular FIG. 8a shows the function of the method as illustrated by a version with complementary, non-redundant main signal spaces 51. The example shows two systems with mutually penetrating fan beams 50. However the configuration between the fan beams may be other than orthogonal, for instance it may be at an arbitrary angle subtended between them. The fan beams 50 are formed by corresponding rows of antennas or sensors 48 and radiation fan-beam shaping devices 49, said fan beams forming the particular main signal spaces 51 by being combined or summed (55). By correlating (54) the main signal spaces 51 with the radiation fan-beams 50, there result radiation-fan-beam signal-spaces 52. Intersection-zone signal-spaces 53 result from correlating (54) corresponding fan beams 50. By multiplying or correlating (54) the corresponding radiation-fan-beam signal-spaces 52 with the pertinent intersection-zone signal-spaces 53, the interim results 56 are obtained which, by means of summing (55) provide the unambiguous result 57 relating to one intersection zone. The interim results (references 56) and the associated operations leading to their formation are a component of the method for the ensuing combination of the fan beams or the intersection-zone signal-spaces.

FIG. 9a corresponds to FIG. 8a. A non-redundant y main signal space 71 is formed by summing the fan beams in the y direction 68, said space 71 being in this example complementary to the x main signal space 70. Again a non-redundant x main signal space 70 is formed by summing the fan beams in the x direction 69, and in this example said space 70 is complementary to the y main signal space 71. By correlating (73) the y main signal space 71 with a y fan beam 68, there results a y radiation-fan-beam signal-space 73. Correspondingly the x main signal space 70 is correlated with an x fan beam 69 to produce an x radiation-fan-beam signal space 72.

Moreover an intersection-zone signal-space is obtained by correlating (76) a y fan beam 68 with an x fan beam 69. The result of this intersection-zone signal-space 76 is multiplied, i.e. correlated with the result of y radiation-fan-beam signal space 73 into the y interim result 75. The result of the intersection-zone signal-space 76 is similarly multiplied, ie correlated with the result of the x intersection-zone signal-space 72 into the x interim result 74. Finally the result is formed by combining, ie summing (77) the x and y interim results 74,75 into an unambiguous result relating to the comparability with other and equally processed intersection zones. A corresponding result can be ascertained for each desired intersection zone.

FIG. 9b shows a flow chart of the sequence of the method of FIG. 8b. The rising sequence of Roman numerals I–IV of FIG. 9b shows the sequence of the method.

Step I considers the case of an unfilled aperture of a number of mutually penetrating fan beams 78 of predeterminable geometries and/or distribution. Reference 78 denotes the formation of several, however at least one intersection zone. The generation of a suitable and selectable main signal space 79, which may be redundant or non-redundant, complementary, gradually complementary or non-complementary, takes place in step II.

The measure of the contribution of each fan beam to the total power or energy associated with or held by said space is obtained by correlation in step III. The result is a fan-beam signal-space 80. Furthermore step III includes the determination by correlation to what extent each intersection zone contributes to the power or energy held by or associated with the fan beams forming the intersection zone. The result is an intersection-zone signal-space 81.

Step IV concerns the combination of the interim results by correlations, ie multiplications and/or summing and/or means of combination probability computations, in order to determine to what extent an intersection zone contributes to the total power or energy held by or associated with said main signal space. The result regarding the reference 82 is unambiguous and allows comparing all such processed intersection zones or measurements in these corresponding directions.

The method of the invention also includes those cases permitting other subdivisions or accessory combinations of the signal spaces (accessory signal spaces) into other subdivision steps leading to the same results.

FIG. 8*b* shows the method of the invention similar to FIG. 8*a*, however with a different combination of the interim results. Any meaningful combination is allowable for combination, provided that thereby the interim results, ie the fan beams, be thereby combined in relation to their proportion of the totals of the power or energy levels.

Commensurately with FIG. 8*a*, FIG. 8*b* shows the shaping of fan beams 60 from corresponding antenna or sensor rows 58 and radiation fan-beam shaping devices 59, main signal spaces 61 in turn being formed by recombination or summing (65). By correlating (64) the main signal spaces 61 with the fan beams 60, the intersection-zone signal-spaces 63 are obtained. The next combination portion takes place in FIG. 8*b* in such manner that first the radiation-fan-beam signal-spaces 62 are combined by summing (65) into the interim result 66. Thereupon the signal space of the interim result 66 is multiplied by, ie correlated in the defined manner with the associated intersection-zone signal-space 63, leading to the result 67 for one intersection zone. FIG. 8*b* therefore shows the sequence of another possible combination variation relative to FIG. 8*a*.

Figure 11A:
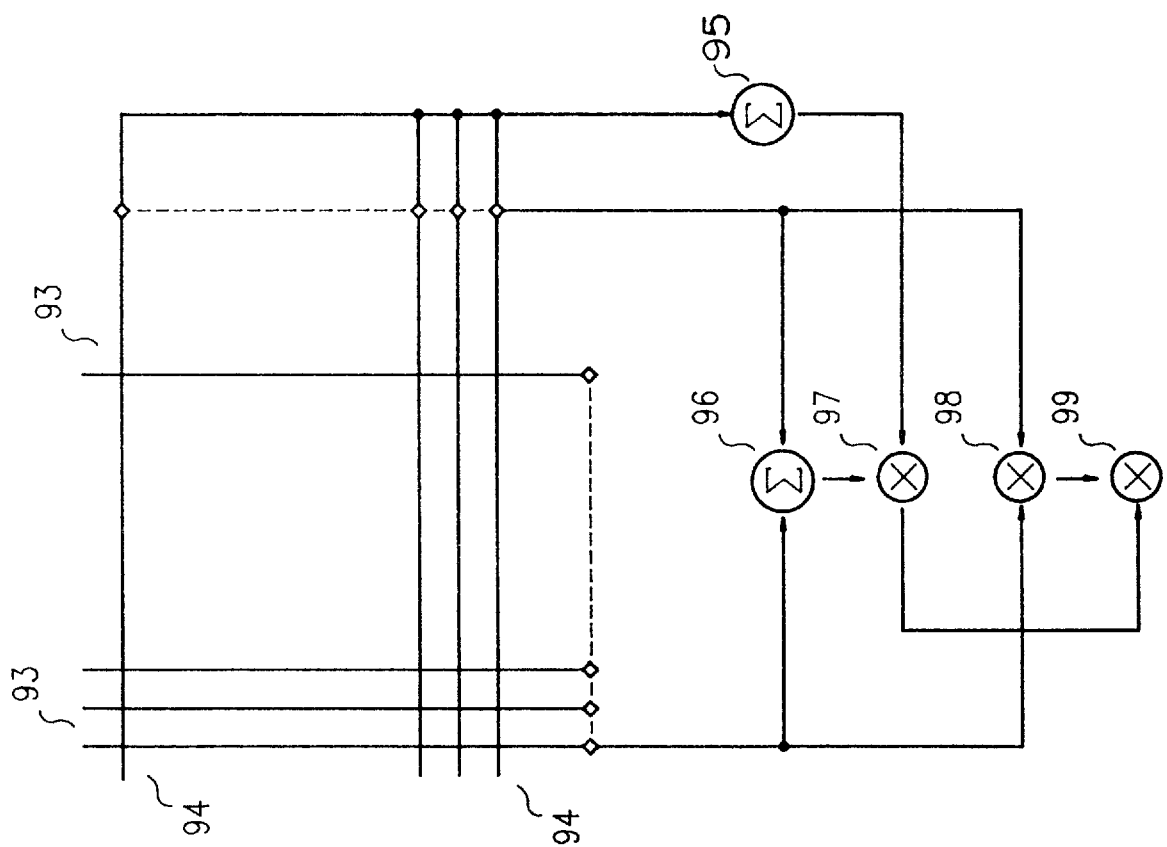
FIG. 11a shows a schematic configuration to couple fan beams in the method of FIG. 10.
Figure 11B:
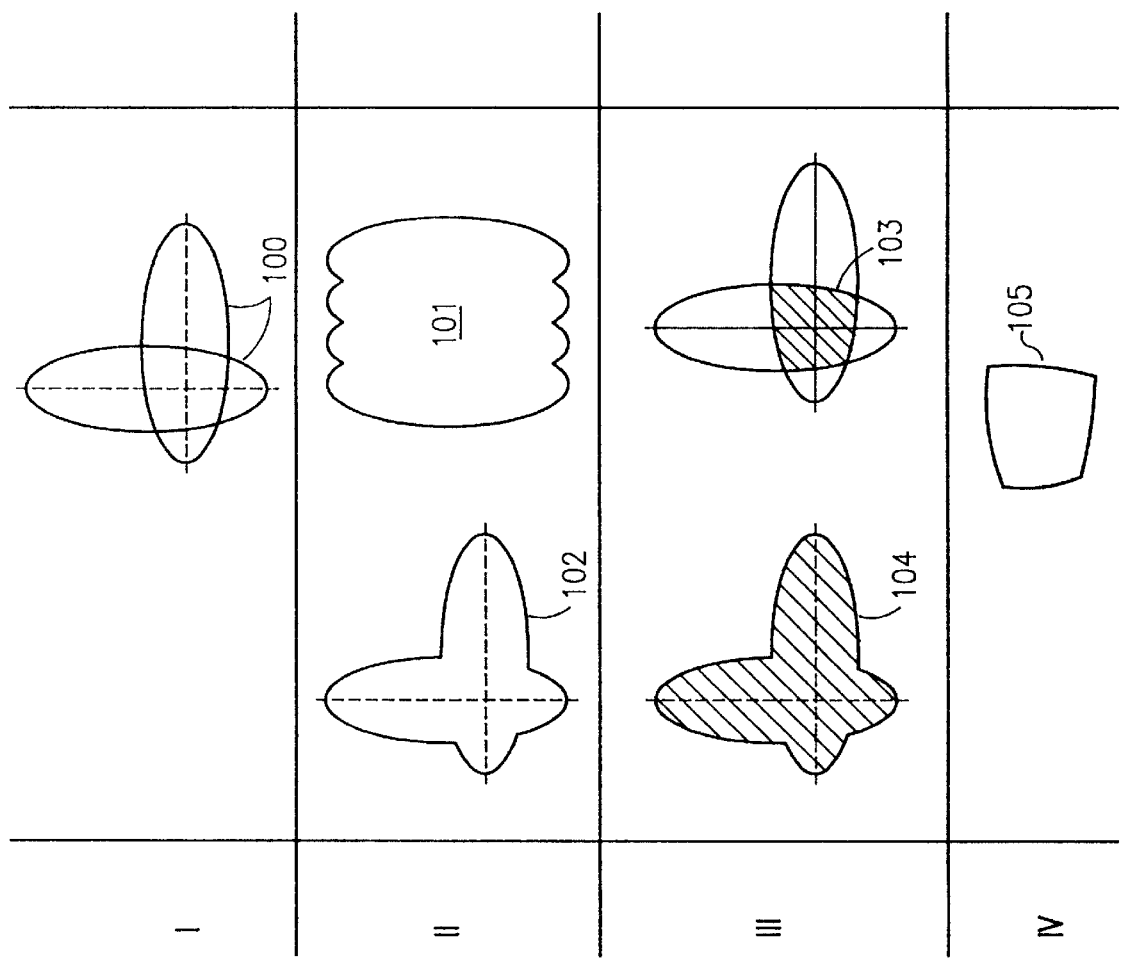
FIG. 11b is a flow chart of the sequence of the method of FIG. 10.

FIGS. 10, 11*a* and 11*b* show a method variation of the invention using only one main signal space for analysis and combining fan-beams participating in an intersection zone, for instance from the x and y directions, into a sub or accessory signal space which thereupon in its combined form is correlated with the main signal space. There results a correlated a signal sub-space or accessory signal space. The signal sub-space is combined by the rules forming a main signal space. When analyzing a main signal space, both redundant and non-redundant main signal spaces may be used. The combination can be selected, depending on the requirements of the signal-space configurations, from present-day procedures. FIGS. 10, 11*a* and 11*b* illustrate a combination comprising forming of and sub-division into sub or accessory signal spaces.

The embodiment of FIG. 10 shows two systems with mutually orthogonally penetrating radian fan beams 85. However the configuration of the fan beams 85 also may be other than orthogonal. The fan beams 85 are shaped from corresponding antenna or sensor rows 83 and from radiation-fan-beam shaping devices 84. However, in FIG. 10, only one main signal space 86 is formed by summing (90) the fan beams 85 from either the x part or the y part of an antenna or sensor configuration 83 or a radiation-fan-beam shaping device 84. Besides the main signal space 86, a sub or accessory signal space 87 also is formed obeying the rules to form main signal spaces by correspondingly combined or summed (90) fan beams 85. A correlated signal sub-space 86 is obtained by correlating (89) the signal sub-space or accessory signal space 87 with the main signal space 86. The correlated signal sub-space 91 represent a measure of probability of the quantity contributed by the signal sub-space 87 to the total power or energy held by the main signal space 86. An intersection-zone signal-space 88 is formed by correlating (89) two corresponding fan beams 85 and represents a measure of probability of which amount the intersection zone contributes to the total power or energy held by the fan beams participating in the intersection zone.

By multiplication, ie correlation as defined herein, the interim results from the correlated signal sub-space 91 and the intersection-zone signal-space 88 are chained into the result 92.

FIG. 11*a* schematically shows signal combination to implement the method of FIG. 10. A non-redundant x main signal space 95 is formed from the fan beams in the x direction 94 by summing (95) [Note: this example would be valid for a redundant main is signal space if at the reference 95 the x fan beams 94 (x1, x2 . . . xn) and y fan beams 93 (y1, y2 . . . yn) were present in the form of a combined main signal space or a signal space composed of them]. Besides the non-redundant main signal space 95, and again obeying the rules to form main signal spaces by combining or summing (96) correspondingly selected x-fan beams 94 and y-fan beams 93, a signal sub-space 96 is formed. By correlating (97) the signal sub-space 96 with the main signal space 95 there results the correlated signal sub-space 97. Moreover, by correlating (98) a y-fan beam 93 with and x-fan beam 94, there results an intersection-zone signal x-fan beam 94, there results an intersection-zone signal space 98. The final combination portion consists in forming the result 99 by multiplying or correlating the correlated signal sub-space 97 with the intersection-zone signal-space 98 into an unambiguous result as regards comparability with other intersection zones processed in equal manner. One result as referenced by 99 can be obtained for each desired intersection.

FIG. 11*b* is a flowchart of the method sequence corresponding to the embodiments relating to FIG. 10 comprising a signal sub-space or accessory signal space formed from fan beams. The rising sequence of Roman numerals I through IV of FIG. 11*b* shows the method sequences.

Step I shows the assumption of an unfilled aperture from a number of predeterminable fan beams 100 which are mutually penetrating in predeterminable geometry and/or distribution. The formation of preferably several, but at least one intersection zone takes place at the reference 100.

Step II comprises the generation of a suitable and selectable main signal space 101 which is redundant or non-redundant, also complementary, gradually complementary or non complementary. Again step II comprises the formation of a sub or accessory signal space 102 by combining or summing fan beams participating in an intersection zone. The combination into a signal sub-space or accessory signal space 102 is carried out under the rules applying to a main signal space.

In step III a correlation is made to determine to what extent each intersection zone contributed to the power or energy of the fan beams forming it. The interim result is an intersection-zone signal-space 103. Also in step III, correlation is used to determine to what extent each signal sub-space or accessory signal space contributes to the total power or energy held by the main signal space. The interim result is a correlated signal sub-space or accessory signal space 104.

The combination of the interim results by correlation or multiplication and/or summing and/or means of combination probability computation to determine to what extent an intersection zone contributes to the total power or energy held by the main signal space is carried out in the final step IV. The result regarding the reference 105 is unambiguous and renders comparable all such processed intersection zones or measurements in these directions of observation.

The method also applies to those cases when other subdivisions or accessory combinations of the signal spaces in other subdivision steps with the same results are permissible.

Figure 12:
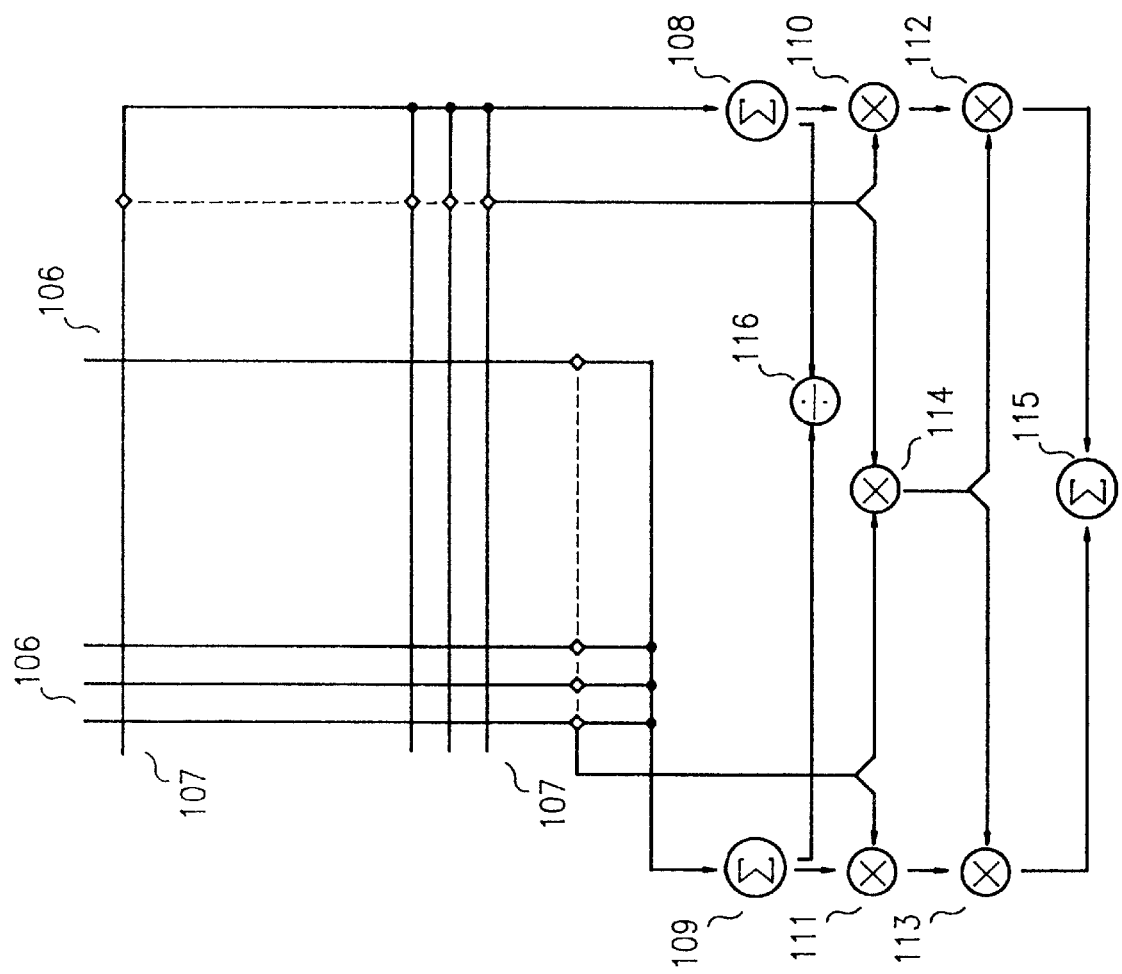
FIG. 12 shows a schematic configuration to couple fan beams for a method optionally processing non-ideal complementarity of both main signal spaces.

FIG. 12 schematically shows combination signals in a manner similar to that shown in FIG. 9a, however with the option to process not ideally complementary, non-redundant main signal spaces or only gradually complementary signal spaces. A non-redundant y main signal space 109 is formed from the fan beams in the y direction 106 by summing at 109, and said space 109 in this instance is only gradually complementary to the x main signal space 108. Also a non-redundant x main signal space 108 is formed from the fan beams in the x direction 107 by summing at 108, and in this instance said space 108 is only gradually complementary to the y main signal space 109. By correlating (111) the y main signal space 109 with a y fan beam 106, there results a y fan beam signal space 111. Correspondingly the correlation 110 of the x main signal space 108 with an x fan beam 107 results in an x fan beam signal space 110. Moreover by correlating (114) a y fan beam 106 with an x fan beam 107, an intersection-zone signal-space 114 is produced. The result of this intersection-zone signal-space 114 is multiplied, ie correlated with the result from the y fan beam signal space 111 into the y interim result 113. Similarly the result of the intersection-zone signal-space 114 is multiplied, ie correlated with the result of the x fan beam signal space 110 into the x interim result 112.

Optionally there may be an additional determination of the ratio 116 of the total power or energy held in the non-redundant x main signal space 108 to that held by the non-redundant y main signal space 109 in the case of incomplete or non-ideal complementarity of the two main signal spaces 108, 109. Illustratively the ratio (116) is formed by dividing the total power or energy held in the x main signal space by that held in the y main signal space. The ratio determination 116 is based on the fact that ad hoc no longer does there exist any signal space across the non-redundant main signal spaces. If for instance the non-redundant x and y main signal spaces are combined by summing, then this would correspond now to a redundant main signal space. Therefore no further non-redundant main signal spaces exist across the non-redundant main signal spaces. Ratio forming introduces weighting which in the case of combination, ie operations regarding the references 108, 109, 110, 111, 112, 113 and upon appropriate selection will have to be taken into account. This option is appropriately applicable to non-redundant main signal spaces or also to signal sub-spaces or accessory signal spaces.

Forming the result as a final combination portion is carried out as a combination or summing 115 the x and y interim results 112, 113, which already were weighted by the ratio formation 116, into an unambiguous result as regards comparability with other intersection zones processed in equal manner. A result such as obtained at 115 can be obtained for every desired intersection zone.

Figure 14:
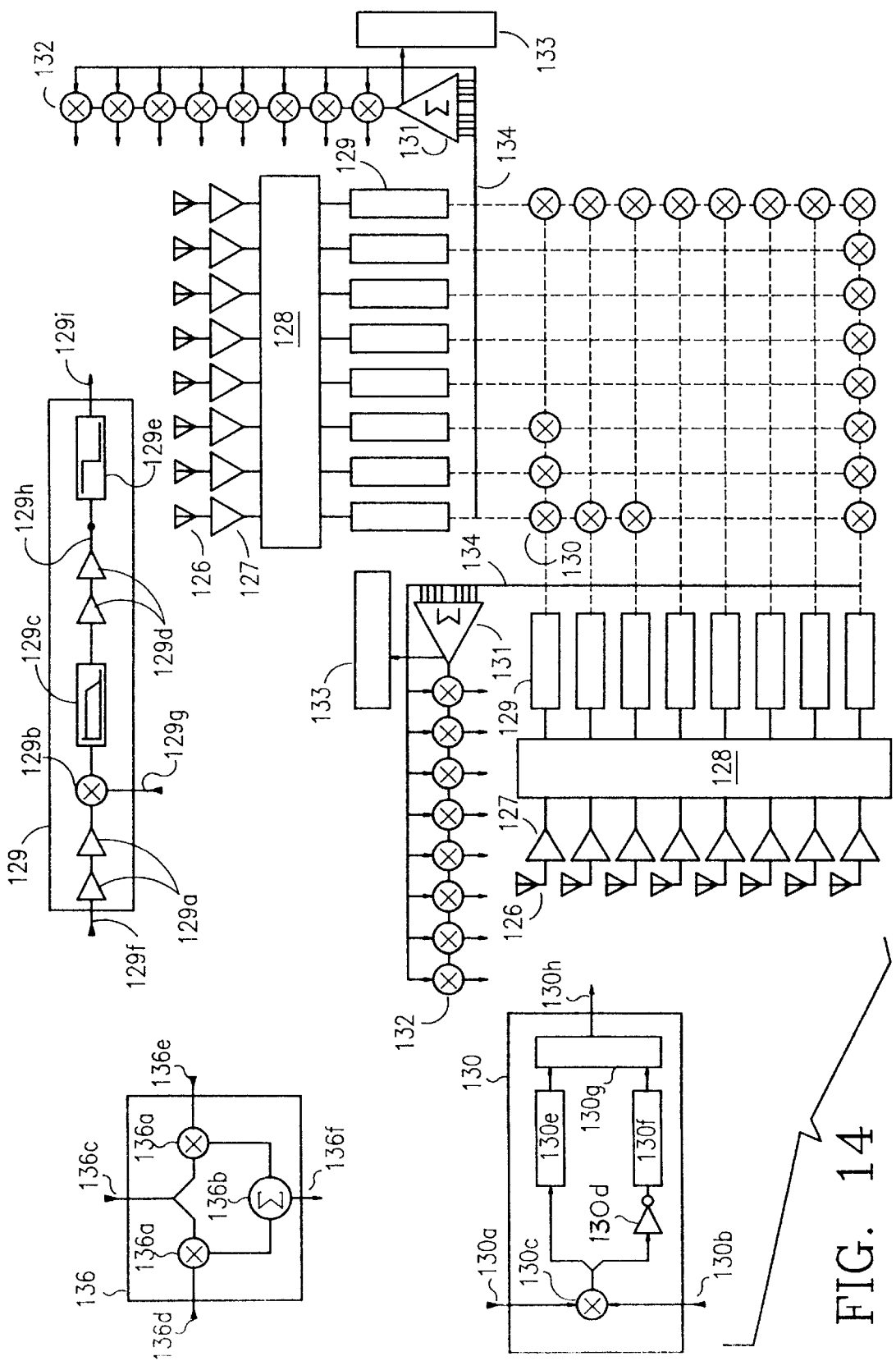
FIG. 14 is a block diagram of an illustrative embodiment of apparatus of the invention with which to carry out the method of the invention.

FIG. 14 is a block diagram of an illustrative embodiment of apparatus of the invention with which to implement the method of the invention, in particular the method discussed in relation to FIG. 12. The apparatus consists of an x-direction antenna row 125 and a y-direction antenna row 126. The two rows of antennas form an orthogonal antenna configuration. Each antenna is followed by an hf amplifier 127.

To form eight fan beams in both the x and y directions, the received signals of the x and y antennas 125, 126 are fed to a corresponding Butler matrix 128. Each output of the x and y Butler matrices leads to a receiver 129 associated to each x and y channel. The input signal 129a of each amplifier 129 is initially amplified further in further hf amplifier stages 129a. Said stages are followed by a mixer 129b directly mixing the signals into the baseband. If, as assumed in this embodiment, spectral-noise signals are involved, then the may be folded about the zero frequency. The oscillator signal is applied at reference 129g.

The mixer 129b is followed by a low-pass filter 129c in turn followed by baseband amplifiers 129d. At the output of the baseband amplifiers 129d, the baseband signal 129h is ready for the ensuing digital quantization. The method of the invention offers the substantial advantage that analysis can be carried out at reduced quantization, down to 1-bit quantization. The correlation providing a statistical measure, it is not necessary to undertake signal quantization into maximum bit resolution across for instance a complete dynamic bit range of a so-called ADC (analog/digital converter) in order to achieve the desired resolution of the received power or energy.

The apparatus of FIG. 14 quantizes the baseband signal 129h into 1-bit values, according to sign, in a null transit detector 129e. The output signal from each receiver is a 1-bit quantized signal 129i. Each output of one of the receivers 129 corresponds to a fan beam belong to the x or y antenna row and being transmitted on a signal line 134. Each x or y signal line 134 leads to an adder 131 having eight inputs and combining the fan beams into a non-redundant x-main signal space or a non-redundant y main signal space. Each fan beam as well as each main signal space is represented by a 1-bit quantized, time signal sequence at the output of the adder 131 for purposes of mutual correlation. The absolute total power or energy can be determined optionally in each case using an analog-digital converter 133 in the corresponding x or y main signal space. The ratio of the two absolute values normalizes, ie weights the main signal spaces one relative to the other. Where two main signal spaces are involved, the total apparatus, independently of the total number of fan beams, only requires two analog-digital converters for absolutely scaling the measurement values. However the apparatus also can determine the unambiguity of each intersection zone and the comparability in the absence of analog-digital converters and in relative form.

Moreover each x receiver output is correlated in a 1-bit correlator 130 with each y receiver output. In the embodiment shown, this results in a total of sixty-four intersection-zone signal-spaces. The correlation takes place in such manner that for instance the signal of one x fan beam is applied to the correlator input 130a and the signal of a y fan beam is applied to the correlator input 130b. The digital 1-bit correlation or multiplication of the x and y signal sequence is implemented by means of an exclusive OR gate 130c. On one hand the exclusive OR gate leads to an up-counter 130e which increases the count by one when the exclusive OR statement is true. On the other hand the exclusive OR gate 130c leads to combining an inverter 130d and an up-counter 130f which increases by one when the exclusive OR statement is false. If for instance identical signals with identical sign sequences are present at both inputs 130a, 130b, then the exclusive OR statement, depending on the defined direction, for instance always would be true and only the up-counter 130e would increase. Following a predetermined summing number corresponding to a time of integration, a difference is formed at 130g between the two up-counter counts. The output 130h provides a measure of probability of the extent of correlation of a particular x fan beam with a particular y fan beam. The "time of integration" is correspondingly selectable in the design of the apparatus while taking into account the selected bandwidth. By correlating (132) the x or y fan beams with the associated main signal spaces, a total of sixteen correlators corresponding to radiation-fan-beam signal-spaces are formed in this embodiment. In this apparatus, the corresponding correlation procedures may be immediately consecutive.

By combination of the outputs 130 and 132, there results a measure of how much a corresponding intersection zone contributes to the total power or energy held in all fan beams. The combination 135 of the apparatus of FIG. 14 takes place in such manner that on one hand the signal from the intersection-zone signal-space 130 at the input 135c is multiplied (135a) by the signal of the x-radiation-fanbeam signal-space 132 at the input 135d and on the other hand with the signal of the y radiation-fanbeam signal-space 132 applied to the input 135e. The results of the two multiplications are combined, ie summed at 135b and as output 135f provide the result regarding an intersection zone or a given direction of observation.

The method of the invention also includes those variations wherein illustratively the fan beams of FIG. 10 are combined into signal sub-spaces or wherein main signal spaces are subdivided into signal sub-spaces.

The purpose of the method of the invention is to form a main signal space from a given number of fan beams and to determine therefrom the extent by which each fan beam contributes to the received power or energy. If this information is known for each fan beam, then an intersection zone will be formed by correlating individual fan beams to indicate what portion the intersection zone contributes to the received power or energy of the fan beams hence participating in the intersection zone. By chaining the interim results so formed, the determination is made what portion the intersection zone contributes to the full main signal space. This procedure leads by arbitrary, variable steps to, or subdivisions into, modified accessory or signal sub-spaces to the same result, namely to determine the received power or energy regarding each intersection zone, and hence to a predeterminable direction of observation, in confusion-free manner, that is, free of ambiguities that might be caused by signals incident from other directions. Herein it is also possible to subdivide the signal spaces, or divide them in accessory manner, and to chain them in permutational manner.

The new method offers the prominent feature of very high processing rates because or reduced quantization. The correlations providing a statistical measure in the form of a variance, quantization of the signal into resolution of maximum bit values across the bit-value dynamic range of a so-called ADC (analog-digital converter) need not be undertaken in order to achieve the desired resolution of the received level or power or energy. Even though the end results retains a desired resolution regarding the received level, a reduced quantization down to a 1-bit value suffices in the method. An example of a 1-bit correlation is a sign correlation. The time signal sequence is quantized depending on signal sign or polarity in this instance. Illustratively a so-called exclusive OR gate is suitable to carry out the multiplication with 1-bit signal sequences. Integration in time of the multiplication results may be carried out in such manner that all logically true exclusive OR gate events and all logically untrue exclusive OR gate events are summed separately over the selected time of integration. At the end of the time of integration, the number of the logically untrue events is subtracted from the number of logically true events to yield the correlation result.

If several correlations are consecutive in the method of the invention, then according to the definition the multiplications can be carried out consecutively also and only if necessary will there be a time of integration at the end method implementation. The event-summing integration with 1-bit correlation moreover allows to carry out in combination the final summing of the two correlation values.

The method of the invention does not carry out a beam shaping process in the rigorously defined manner, for instance in the form of vectorial summing. Essentially directional resolution is carried out conventionally using the above described known procedures. On the other hand the method of the invention resolves the ambiguities which are picked up across the system fanbeam plots in the form of spurious sources or signals incident from directions other than the direction of observation. The apparatus of the invention makes it possible to assess the signals directionally, however the applied total received power or energy is also picked up by the system which is required to appropriately and completely process it.

The method of the invention is applicable to measuring or analyzing received power or energy, for instance when using radio-astronomical, RIO (relative ionospheric opacity)-metric or radiometric instruments for unambiguous and simultaneous determinations in a predeterminable number of directions or determined directions, that shall be confusion-free.

The method of the invention is applicable to systems of telecommunications, position finding and search/reconnaissance wherein are simultaneously carried out, in a predeterminable number of directional determinations, unambiguous measurements or analyses in confusion-free manner of the received power or energy.

What is claimed is:

1. A method for determining incident received power or energy or other measurement values related to the received power or energy of at least one signal in at least one predeterminable direction of observation, comprising:
   (a) detecting an incident signal using sensors,
   (b) forming fan beams associated to individual sensors, sets of sensors or sensor zones of the sensors,
   (c) forming at least one intersection zone of at least two fan beams,
   (d) forming at least one main signal space evincing the configuration of a number of fan beams and representing the received power or energy associated to these fan beams,
   (e) selecting at least one intersection zone,
   (f) for each fan beam participating in the formation of the selected intersection zone, determining a measure for the portion of the total received power or energy associated to the main signal space, (g) determining a measure for the portion associated with the selected intersection zone of the received power or energy relating to the fan beams participating in forming the inter section zone, and (h) combining the measurements carried out in steps (f) and (g) to form a measure for the portion of received power or energy incident in the predetermined direction of observation of the total received power or energy associated with the main signal space.

2. Method as claimed in claim 1, wherein the measure for the portion of each fan beam participating in forming an intersection zone of the total power or energy associated with the main signal space is determined by correlating the particular fan beam with the main signal space.

3. Method as claimed in claim 1, wherein the measure for the portion associated with the selected intersection zone of the received power or energy associated with the fan beams forming said intersection zone is obtained by correlating the fan beams participating in forming the intersection zone.

4. Method as claimed in claim 1, wherein the fan beams form at least two, preferably more than two intersection zones in such manner that different directions of observation can be selected by selecting different intersection zones.

5. Method as claimed in claim 1, wherein at least three fan beams form a spatial intersection zone constituting a region of observation in such manner that the received power or energy from the region of observation can be determined.

6. Method as claimed in claim 1, wherein the incident received power or energy is determined simultaneously in at least two directions of observation and/or for at least two regions of observation.

7. Method as claimed in claim 1, and further comprising determining the total received power or energy associated with the main signal space or a measure of this total received power or energy.

8. Method as claimed in claim 1, wherein the main signal space is generated and represented according to the shape of fan beams and the received power or energy associated with these fan beams or in that the main signal space is formed by vectorially summing fan beams.

9. Method as claimed in claim 1, wherein the measures formed in steps (f) and (g) in step (h) are added or multiplied in weighted or unweighted form.

10. Method as claimed in claim 1, wherein the main signal space is sub-divided into signal sub-spaces.

11. Method as claimed in claim 1, wherein the incident received power or energy is determined in continuous or discrete time and in that the method is implemented in real time.

12. Method as claimed in claim 1, wherein at least two main signal spaces are formed.

13. Method as claimed in claim 12, wherein the main signal spaces are redundant or non-redundant and complementary or non-complementary.

14. Method as claimed in claim 5, wherein the spatial position of an object is determined by ascertaining the received power or energy from the region of observation.

15. Method as claimed in claim 5, wherein the positions of several objects are determined simultaneously by simultaneously selecting several regions of observation.

16. Method as claimed in claim 1, wherein at least one object is at least partly scanned by a consecutively different selection of the direction of observation or the region of observation or by simultaneously selecting several directions of observation or regions of observation.

17. Method as claimed in claim 16, wherein the energy or power distribution of the object(s) determined by scanning the object(s) is used to image the object(s).

18. Method as claimed in claim 1, wherein the position of at least one stationary object and the position of at least one movable object is determined.

19. Method as claimed in claim 1, wherein the position of a movable object is monitored by the consecutively different selection of the direction of observation or the region of observation.

20. Method as claimed in claim 1, wherein the signal of which the received power or energy is being determined consists of a radiometric signal or a signal which is passively and actively emitted or reflected by an object.

21. Method as claimed in claim 1, and further comprising determining the received power or energy resulting from the absorption by an object present in a direction of observation and a region of observation.

22. Method as claimed in claim 1, wherein the received power or energy of a signal is determined as a measure of the absorption of this signal by an object present in the direction of observation or in a region of observation.

23. Method as claimed in claim 1, wherein the fan beams are generated by beam shaping means.

24. Method as claimed in claim 1, wherein the sensors evince an unfilled aperture, in particular composed of at least two rows of sensors, each with sensors in a row.

25. Method as claimed in claim 24, wherein an intersection zone consists of at least one fan beam associated with the first row of sensors and at least one fan beam associated with the second row of sensors.

26. Method as claimed in claim 1, wherein the signal of which the incident received power or energy is being determined is formed by radio waves reflected and diffracted by a meteorite trail of at least one meteorite moving in the earth atmosphere.

27. Method as claimed in claim 1, wherein by simultaneously selecting at least two directions of observation or regions of observation, at least two signals reflected by the meteorite trails of different meteorites are received simultaneously.

28. Method as claimed in claim 1, wherein the fan beams forming the main signal space are rigorously predeterminable or selectable.

29. Method as claimed in claim 24, wherein each fan beam associated with a row of sensors can be correlated with a main signal space associated with said fan beam and with each fan beam associated with another row of sensors.

30. Method as claimed in claim 12, and further comprising, as regards a selected intersection zone:

a first correlation result is formed by correlating the fan beams participating in the formation of the intersection zone, a second correlation result is formed by correlating a fan beam participating in the formation of the intersection zone with a first main signal space associated with said fan beam, a third correlation result is formed by correlating another fan beam participating in the formation of the intersection zone with a further main signal space associated to said fan beam, the first correlation result is combined by multiplication with the second correlation result into a first interim result, the third correlation result is combined, by multiplication, with the first correlation result into a second interim result, and the first interim result and the second interim result are combined by addition, to form the measure defined in step (h).

31. Method as claimed in claim 1 wherein the main signal space is generated or represented according to the shape of fan beams and the received power or energy associated with these fan beams or in that the main signal space is formed by vectorially summing fan beams.

32. Method as claimed in claim 1, wherein the incident received power or energy is determined in continuous or discrete time or in that the method is implemented in real time.

33. Method as in claim 12, wherein the main signal spaces are redundant or non-redundant or complementary.

34. Method as claimed in claim 1, wherein the position of at lest one stationary object or the position of at least one movable object is determined.

35. Method as claimed in claim 1, wherein the signal of which the received power or energy is being determined consists of a radiometric signal or a signal which is passively or actively emitted or reflected by an object.

36. Method as claimed in claim 1 and further comprising determining the received power or energy resulting from the absorption by an object present in a direction of observation or a region of observation.

37. Method as claimed in claim 1, wherein the signal of which the incident received power or energy is being determined is formed by radio waves reflected or diffracted by a meteorite trail of at least one meteorite moving in the earth atmosphere.

38. Apparatus for determining incident power or energy or other values related to the received power or energy of a signal in at least one predeterminable direction of observation, comprising:

sensor systems to detect at least one signal, beam shaping means to form fan beams from output signals of individual sensors or sensor zones of the sensor systems, at least two fan beams forming one intersection zone, means to form at least one main signal space representing the shape of a number of fan beams and the received power of energy associated with said fan beams, selection means to select at least one intersection zone to select at least one direction of observation, analyzers to determine a first measure of the portion of each fan beam participating in the formation of the selected intersection zone of the total received power or energy associated with the main signal space and to determine a second measure for the portion of the selected intersection zone of the received power or energy associated with the fan beams participating in the formation of the intersection zone, and combination means to chain the first measure determined by the analyzers with the second measure determined by the analyzers.

39. Apparatus as claimed in claim 38, wherein the analyzers comprise at least one correlator to determine the first measure by correlating the particular fan beam with the associated main signal space and at least one correlator to determine the second measure correlating with each other the fan beams participating in the formation of the intersection zone.

40. Apparatus as claimed in claim 38, wherein the analyzers comprise at least one correlator to determine the first measure by correlating the particular fan beam with the associated main signal space or at least one correlator to determine the second measure correlating with each other the fan beams participating in the formation of the intersection zone.

41. Apparatus as claimed in claim 38, wherein the selection means are designed to simultaneously select at least two intersection zones.

42. Apparatus as claimed in claim 38, and further comprising means to determine the total received power or energy associated with the main signal space or to determine the received power or energy associated with one fan beam.

43. Apparatus as claimed in claim 38, wherein the means to form at least one main signal space comprises devices for vectorially summing, in analog or digital manner, fan beams and at least one additional sensor.

44. Apparatus as claimed in claim 38, wherein the means of forming at least one main signal space comprises devices for vectorially summing, in analog or digital manner, fan beams or at least one additional sensor.

45. Apparatus as claimed in claim 38, wherein the combination means comprise at least one multiplier and at least one adder for the weighted or unweighted multiplication and addition in particular of the first measure by and to the second measure.

46. Apparatus as claimed in claim 38, wherein the combination means comprise at lest one multiplier or at least one adder for the weighted or unweighted multiplication or addition in particular of the first measure by or to the second measure.

47. Apparatus as claimed in claim 38, wherein the sensor systems comprise at least two rows of sensors each evidencing sensors in a row.

48. Apparatus as claimed in claim 38, wherein the sensors are acoustic sensors and sensor detecting heat radiation and sensors detecting electromagnetic radiation.

49. Apparatus as claimed in claim 38, wherein the sensors are acoustic sensors or sensor detecting heat radiation or sensors detecting electromagnetic radiation.

50. Apparatus as claimed in claim 47, wherein the sensor rows each comprise the same number of sensors.

51. Apparatus as claimed in claim 47, wherein the beam shaping means comprise at least two beam-shaping devices each associated to a row of sensors and forming a predeterminable number of fan beams from the output signals of the particular row of sensors.

52. Apparatus as claimed in claim 51, wherein the beam-shaping devices each consists of a Butler matrix operating in analog or digital manner.

53. Apparatus as claimed in claim 51, wherein at least one quantizing device is placed after the outputs of each beam-shaping device and quantizes the signal representing a fan beam associated to an output of the beam-shaping device.

54. Apparatus as claimed in claim 53, wherein each output of the beam-shaping device is followed by an associated quantizing device.

55. Apparatus as claimed in claim 39, wherein each output of the beam-shaping device is followed by a correlator to correlate the fan beam representing said output with an associated main signal space and a correlator to correlate the particular fan beam with another fan beam represented by the output signal from another beam-shaping device.

56. Apparatus as claimed in claim 39, wherein each output of the beam-shaping device is followed by a correlator to correlate the fan beam representing said output with an associated main signal space or a correlator to correlate the particular fan beam with another fan beam represented by the output signal from another beam-shaping device.

57. Apparatus as claimed in claim 38, wherein, as regards a selected intersection zone, the combination means chain together at least a first correlation result obtained by correlating the fan beams participating in the formation of the intersection zone, and a second correlation result obtained by correlating a fan beam participating in the formation of the intersection zone with a first main signal space associated to this fan beam, and a third correlation result obtained by correlating another fan beam participating in the formation of the intersection zone with a further main signal space associated to this fan beam.

58. Apparatus as claimed in claim 38, wherein, as regard a selected intersection zone, the combination means chain together at least
- a first correlation result obtained by correlating the fan beams participating in the formation of the intersection zone, or
- a second correlation result obtained by correlating a fan beam participating in the formation of the intersection zone with a first main signal space associated to this fan beam, or
- a third correlation result obtained by correlating another fan beam participating in the formation of the intersection zone with a further main signal space associated to this fan beam.

59. Apparatus as claimed in claim 57, wherein as regards the selected intersection zone, the combination means
- chain, by multiplication, the first correlation result with the second correlation result into a first interim result,
- chain, by multiplication, the third correlation result with the first correlation result into a second interim result, and
- chain, by addition, the first interim result and the second interim result.

* * * * *